United States Patent
Nara et al.

(10) Patent No.: US 9,310,656 B2
(45) Date of Patent: *Apr. 12, 2016

(54) METHOD FOR MANUFACTURING DISPLAY ELEMENT, MANUFACTURING APPARATUS OF DISPLAY ELEMENT AND DISPLAY DEVICE

(71) Applicant: NIKON CORPORATION, Tokyo (JP)

(72) Inventors: Kei Nara, Yokohama (JP); Tomohide Hamada, Yokohama (JP)

(73) Assignee: NIKON CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/855,206

(22) Filed: Apr. 2, 2013

(65) Prior Publication Data

US 2013/0224894 A1 Aug. 29, 2013

Related U.S. Application Data

(63) Continuation of application No. 12/718,450, filed on Mar. 5, 2010, now Pat. No. 8,432,528, which is a continuation of application No. PCT/JP2008/002385, filed on Sep. 1, 2008.

(30) Foreign Application Priority Data

Sep. 5, 2007 (JP) ................................ 2007-229608

(51) Int. Cl.
*G02F 1/13* (2006.01)
*G02F 1/1345* (2006.01)
(Continued)

(52) U.S. Cl.
CPC .......... *G02F 1/13452* (2013.01); *G02F 1/1303* (2013.01); *G02F 1/1368* (2013.01);
(Continued)

(58) Field of Classification Search
None
See application file for complete search history.

(56) References Cited

U.S. PATENT DOCUMENTS 5,929,961 A 7/1999 Nishi et al.
6,320,640 B2 11/2001 Nishi et al.
(Continued)

FOREIGN PATENT DOCUMENTS

| CN | 1392439 A | 1/2003 |
|---|---|---|
| JP | 2003-263119 | 9/2003 |

(Continued)

OTHER PUBLICATIONS

Office Action issued in Japanese Patent Application No. 2009-531107 by the Japanese Patent Office on Jun. 4, 2012. English language translation enclosed. (6 pages total).

(Continued)

*Primary Examiner* — Richard Kim
(74) *Attorney, Agent, or Firm* — Finnegan, Henderson, Farabow, Garrett & Dunner, L.L.P.

(57) ABSTRACT

A manufacturing apparatus of display element which forms highly reliable drive circuits or thin-film transistors on a flexible substrate, a manufacturing method, and a highly reliable display element are provided. A display element (50) includes a flexible substrate (FB), a first partition wall and second partition wall (BA) formed by pressing the flexible substrate, a lyophobic surface (PJ) formed on surfaces of the first partition wall and the second partition wall, and electrodes (S, P) formed by applying droplets onto a groove portion formed between the first partition wall and second partition wall. It is also possible for a lyophilic surface to be formed on the surface of the groove portion (GR) between the first partition wall and second partition wall (BA).

11 Claims, 18 Drawing Sheets

(51) Int. Cl.

| | | |
|---|---|---|
| *G02F 1/1362* | (2006.01) | |
| *G02F 1/1368* | (2006.01) | |
| *H01J 9/14* | (2006.01) | |
| *H01L 51/00* | (2006.01) | |
| *H01L 51/56* | (2006.01) | |
| *H05B 33/10* | (2006.01) | |
| *G02F 1/1333* | (2006.01) | |
| *H01L 51/52* | (2006.01) | |
| *H01L 27/32* | (2006.01) | |

(52) U.S. Cl.
CPC .......... *G02F1/136286* (2013.01); *H01J 9/148* (2013.01); *H01L 51/0005* (2013.01); *H01L 51/0022* (2013.01); *H01L 51/56* (2013.01); *H05B 33/10* (2013.01); *G02F 1/133305* (2013.01); *G02F 2001/136295* (2013.01); *H01L 27/3246* (2013.01); *H01L 27/3248* (2013.01); *H01L 27/3274* (2013.01); *H01L 51/52* (2013.01); *H01L 51/5206* (2013.01); *H01L 2227/323* (2013.01); *H01L 2251/5338* (2013.01)

(56) References Cited

U.S. PATENT DOCUMENTS

| | | | |
|---|---|---|---|
| 6,429,910 | B1 | 8/2002 | Hirata et al. |
| 6,839,123 | B2 | 1/2005 | Nishi et al. |
| 7,641,935 | B2 | 1/2010 | Liu et al. |
| 8,432,528 | B2 * | 4/2013 | Nara et al. .................... 349/187 |
| 2002/0033664 | A1 | 3/2002 | Kobayashi |
| 2005/0008769 | A1 | 1/2005 | Sakai |
| 2005/0271803 | A1 | 12/2005 | Liu et al. |
| 2006/0040435 | A1 | 2/2006 | Morisue et al. |
| 2006/0110908 | A1 | 5/2006 | Moriya et al. ................ 438/617 |
| 2006/0166111 | A1 | 7/2006 | Umetsu et al. .................... 430/5 |
| 2006/0290021 | A1 | 12/2006 | Li et al. |
| 2007/0085472 | A1 | 4/2007 | Yamakawa et al. |

FOREIGN PATENT DOCUMENTS

| | | |
|---|---|---|
| JP | 2003-272837 | 9/2003 |
| JP | 2004-98012 | 4/2004 |
| JP | 3698749 | 7/2005 |
| JP | 2006-93667 | 4/2006 |
| TW | 544539 B | 8/2003 |
| TW | 200508787 A | 3/2005 |
| TW | 200540533 A | 12/2005 |
| WO | WO 01/63975 | 8/2001 |
| WO | WO 03/001490 | 1/2003 |

OTHER PUBLICATIONS

Office Action issued in Chinese Patent Application No. 200880105587.5 by the Chinese Patent Office on Jul. 26, 2011. English language translation enclosed. (18 pages total).
Office Action issued in Chinese Patent Application No. 200880105587.5 by the Chinese Patent Office on Jul. 31, 2012. English language translation enclosed. (18 pages total).
European Search Report issued in corresponding European Patent Application No. 08790539.4, dated Aug. 18, 2011.
International Search Report of related PCT/JP2008/002385 dated Nov. 18, 2008.
Written Opinion of the International Searching Authority issued on related PCT/JP2008/002385.
Office Action issued for Taiwanese Patent Application No. 97132886 by the Taiwan Intellectual Patent Office on Jan. 23, 2015.

\* cited by examiner (d-1)

(d-2)

(d-3)

(d-4)

METHOD FOR MANUFACTURING DISPLAY ELEMENT, MANUFACTURING APPARATUS OF DISPLAY ELEMENT AND DISPLAY DEVICE

This is a continuation of application Ser. No. 12/718,450, filed Mar. 5, 2010 (allowed), which is a continuation of International Patent Application No. PCT/JP2008/002385, filed on Sep. 1, 2008, all of which are incorporated herein by reference.

TECHNICAL FIELD

The present invention relates to a flat panel display element such as an organic electroluminescence (EL) element, a liquid crystal display element, a field emission display (FED), or the like. Furthermore, the present invention also relates to a manufacturing method and manufacturing apparatus of this display element, and particularly relates to a manufacturing method and manufacturing apparatus of a display element that also manufactures a drive circuit that drives a display element.

BACKGROUND

Display elements such as liquid crystal display elements have features that include a small size, a small thickness (thin), low power consumption, and a light weight. Because of this, currently, the display elements are widely used in various types of electronic equipments. Drive circuits or thin-film transistors that drive these display elements are generally manufactured using an exposure apparatus referred to as a stepper.

However, the size of liquid crystal display elements, in particular, is becoming ever larger, and because of issues such as manufacturing costs and device transporting limitations and the like, the eighth and subsequent generations of such elements have reached the point where they cannot be manufactured using technology which is simply a scaled-up extension of the conventional technology as too many problems exist. Moreover, in order to reduce manufacturing costs, in addition to improving efficiency by increasing the substrate size, considerable impediments exist such as reducing device costs, reducing running costs, and improving the yield of large size panels.

Moreover, organic EL and field emission displays and the like have also begun to appear in the market, and reducing device costs and reducing running costs are also big problems in the manufacturing of these next generation display elements as well.

Patent document 1 discloses a method in which liquid crystal display elements are manufactured in roll shape as a measure to reduce the device costs of liquid crystal display element and running costs.

[Patent document 1] Japanese Patent Publication No. 3698749

[Patent document 2] U.S. Pat. No. 6,320,640

[Patent document 3] U.S. Pat. No. 6,839,123

The example disclosed in Patent document 1 discloses a method of manufacturing passive liquid crystal cells which can be easily manufactured. However, this method cannot be used to manufacture display devices having drive circuits or thin-film transistors with high precision which are in current use. Moreover, in Patent document 1, electrodes are formed by applying conductive ink using a droplet applying method. However, this conductive ink is not always applied accurately, and in such cases, display elements having a low level of reliability end up being manufactured in large volume. Moreover, when wiring is formed using a droplet applying method, the applied droplets become spread out over the wiring formation surface, and it has been difficult to narrow the line width of the wiring. Furthermore, the applied droplets show a ready tendency to roll over the wiring formation surface, and it has been difficult to form a continuous line in the desired area.

Therefore, it is an object of the present invention to provide a method for manufacturing display element in which it is easy to control the position of the wiring even when the wiring has a narrow line width. It is a further object of the present invention to provide a manufacturing apparatus of display element that forms highly reliable drive circuits or thin-film transistors on a flexible substrate, and a highly reliable display element.

SUMMARY

A method for manufacturing display element according to a first aspect includes: forming a first partition wall and a second partition wall on a substrate which is fed in a longitudinal direction; imparting a lyophobic property on the first partition wall and the second partition wall; and applying droplets onto a groove portion formed between the first partition wall and the second partition wall.

According to this manufacturing method, because lyophobic property has been imparted on the first partition wall and the second partition wall, even if droplets are applied by mistake on the first partition wall and second partition wall when they are being applied onto the groove portions, the droplets are repelled by the partition walls and roll down into the groove portions. Accordingly, it is difficult for defective products to occur even if the substrate is being fed at high speed or the droplets are difficult to be applied accurately.

A method for manufacturing display element according to a second aspect includes: forming a first partition wall and a second partition wall on a substrate which is fed in a longitudinal direction; imparting a lyophilic property on a groove portion formed between the first partition wall and the second partition wall; and applying droplets onto the groove portion.

According to this manufacturing method, because lyophilic property is imparted on the groove portions, droplets are not repelled (splashed) from the groove portions when they fall onto the groove portions. Accordingly, electrodes and the like that are formed by droplets are accurately formed in the groove portions and it is difficult for defective products to occur.

A method for manufacturing display element according to a third aspect includes: forming a partition wall in which a concavo-convex portion is formed on a substrate which is fed in a longitudinal direction; imparting a lyophobic property on the convex portion; and applying droplets onto the concave portion.

According to this manufacturing method, because lyophobic property has been imparted on the convex portion, even if droplets are applied by mistake onto the convex portion when they are being applied onto the concave portion, the droplets are repelled by the convex portion and roll down into the concave portion. Accordingly, it is difficult for defective products to occur even if the substrate is being fed at high speed or the droplets are difficult to be applied accurately.

A method for manufacturing display element according to a fourth aspect includes: forming a partition wall in which concavo-convex portion is formed on a substrate which is fed in a longitudinal direction; imparting a lyophilic property on the concave portion; and applying droplets onto the concave portion.

According to this manufacturing method, because lyophilic property is imparted on the concave portion, droplets are not repelled from the concave portion when they fall onto the concave portion. Accordingly, electrodes and the like that are formed by droplets are accurately formed in the concave portion and it is difficult for defective products to occur.

A display element according to a fifth aspect includes: a substrate; a first partition wall and a second partition wall that are formed by pressing the substrate; a lyophobic surface that is formed on surfaces of the first partition wall and second partition wall; and an electrode that is formed by applying droplets onto a groove portion formed between the first partition wall and the second partition wall.

The display element includes lyophobic surfaces on the surfaces of the first partition wall and the second partition wall, so that droplets that are applied by mistake onto the partition walls do not remain adhered to the partition walls. As a result, it is possible to provide a highly reliable display element.

A display element according to a sixth aspect includes: a substrate; a first partition wall and a second partition wall that are formed by pressing the substrate; a lyophilic surface that is formed on a surface of a groove portion formed between the first partition wall and the second partition wall; and an electrode that is formed by applying droplets onto the groove portion.

Because the lyophilic surface is formed on the groove portion formed between the first partition wall and the second partition wall of the display element, droplets become attached to the groove portion and an electrode is formed. Because of this, even if shocks or vibration or the like are applied to the display element, it is still possible to provide a highly reliable display element.

A manufacturing apparatus of display element according to a seventh aspect includes: a rotating mold that forms a first partition wall and a second partition wall on a substrate which is fed in a longitudinal direction by pressing; a lyophobic property imparting section that imparts a lyophobic property on the first partition wall and the second partition wall; and an applying section that applies droplets onto a groove portion formed between the first partition wall and the second partition wall.

Because this manufacturing apparatus of display element includes a lyophobic property imparting section which imparts lyophobic property on the first partition wall and the second partition wall, even if the droplets were applied onto the partition walls by mistake when the applying section applies the droplets, those droplets roll down to the groove portion. As a result, it is possible to manufacture a highly reliable display element.

A manufacturing apparatus of display element according to an eighth aspect includes: a rotating mold that forms a first partition wall and a second partition wall on a substrate which is fed in a longitudinal direction by pressing; a lyophilic property imparting section that imparts a lyophilic property on a groove portion formed between the rust partition wall and the second partition wall; and an applying section that applies droplets onto the groove portion.

Because this manufacturing apparatus of display element includes a lyophilic property imparting section which imparts lyophilic property on the groove portion formed between the first partition wall and the second partition wall, droplets applied by the applying section reliably roll down into the groove portions in a substrate. As a result, it is possible to manufacture a highly reliable display element.

The manufacturing method and manufacturing apparatus of display element according to the present invention make it possible to manufacture a highly reliable display device at low cost. In addition, this extremely reliable display device is also resistant to impact and vibration and the like.

BRIEF DESCRIPTION OF THE DRAWINGS

FIG. 2A (a-2) is a cross-sectional view taken along a line c-c in FIG. 2A (a-1).

FIG. 2B (b-2) is an enlarged view of the gate electrode G with the numbers from 1 to 9 showing the applying sequence. FIG. 2B (b-3) is a cross-sectional view showing a state in which metal ink MI has rolled into a groove portion for a gate bus line GBL. FIG. 2B (b-4), FIG. 2B (b-5) and FIG. 2B (b-6) are cross-sectional views showing states from which the metal ink MI does not enter a groove portion for a gate bus line GBL but instead falls onto a partition wall to which the metal in MI has rolled into the groove portion. FIG. 2B (b-7) is a cross-sectional view taken after the metal ink MI has undergone heat processing.

FIG. 2B (d-1) is a top view in which a source bus line SBL and a pixel electrode P have been formed. FIG. 2B (d-2), FIG. 2B (d-3) and FIG. 2B (d-4) are top views and corresponding cross-sectional views showing states in which the metal ink MI rolls into a groove portion for a pixel electrode P.

FIG. 2E (e-2) is a view showing a state in which organic Semiconductor ink OS were applied between the source electrodes S and the drain electrodes D by an organic semiconductor droplet applying apparatus 20OS.

FIG. 2F (f-2), FIG. 2F (f-3) and FIG. 2F (f-4) are top views and corresponding cross-sectional views showing states in which the droplets for the light emitting layer are formed gradually on the pixel electrode P.

FIG. 3(*b*) and

FIG. 3(*c*) are cross-sectional views taken respectively along the lines b-b and c-c in FIG. 3(*a*).

DESCRIPTION OF EMBODIMENTS

The manufacturing apparatus of display element described in the present embodiment can be applied to manufacture organic EL elements, liquid crystal display elements, and field emission display elements. Firstly, a description will be given of an apparatus and method for manufacturing organic EL elements.

[[Example 1: Manufacturing Apparatus of Organic EL Element]]

In the manufacturing of an organic EL element, it is necessary to form a substrate on which a thin-film transistor (TFT) and pixel electrode are formed. In order to accurately form one or more organic compound layers (i.e., light emitting element layers) which include a light emitting layer on the pixel electrode which is formed on this substrate, it is necessary to form partition wall BA (i.e., a bank layer) simply and accurately in boundary areas between the pixel electrodes.

Figure 1:
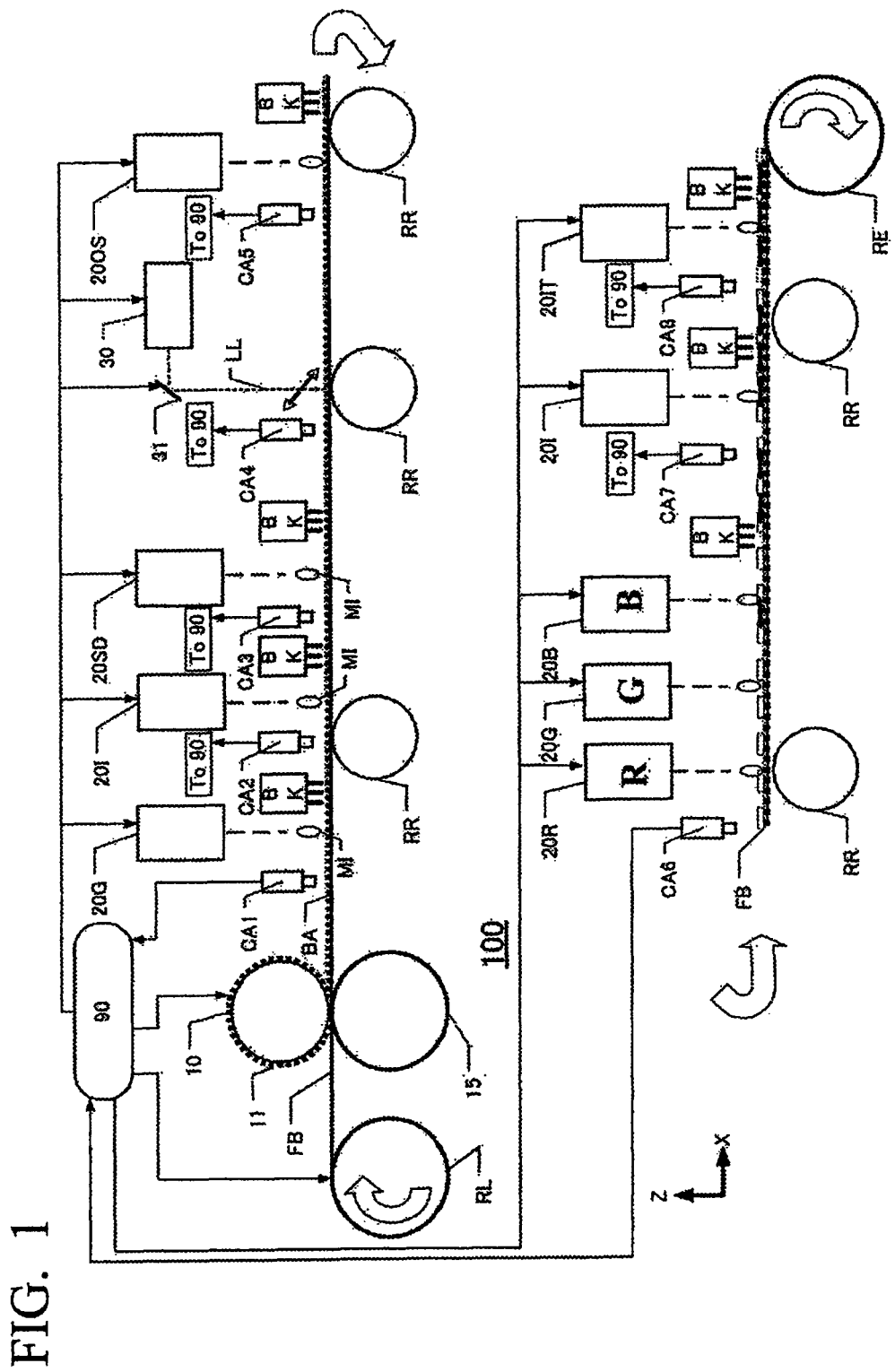
FIG. 1 is a schematic view showing the structure of a manufacturing apparatus 100 that manufactures organic EL elements on a flexible substrate FB.

FIG. 1 is a schematic view showing the structure of a manufacturing apparatus 100 which manufactures organic EL elements which have pixel electrodes and light emitting layers and the like on a flexible substrate.

The manufacturing apparatus 100 of organic EL element is provided with a supply roll RL for feeding a belt-shaped flexible sheet substrate FB which has been wound into a roll shape. The length of the sheet substrate FB is, for example, 200 meters or more. As a result of the supply roll RL rotating at a predetermined speed, the sheet substrate FB is fed in the X-axial direction (i.e., the longitudinal direction) which is the transporting direction. In addition, the manufacturing apparatus 100 of organic EL element is provided with rollers RR in a plurality of locations and the sheet substrate FB is also fed in the X-axial direction by the rotation of these rollers RR. The rollers RR may be rubber rollers which grip the sheet substrate FB from both surfaces thereof, or, if the sheet substrate FB has perforations, then the rollers RR may be ratchet rollers. Some of these rollers RR are able to move in a Y-axial direction which is orthogonal to the transporting direction.

The manufacturing apparatus 100 of organic EL element is provided with a wind-up roll RE onto which the sheet substrate FB is wound in a roll shape in the final process thereof. Instead of the wind-up roll RE, it is also possible to provide a cutting apparatus (not shown) that cuts the sheet substrate FB to a predetermined size. Moreover, in order for the processing in the defective portion repair process to be performed, the sheet substrate FB is wound onto the wind-up roll RE or cut by the cutting apparatus at a predetermined speed which is synchronized with that of the supply roll RL and the rollers RR.

[Partition Wall Forming Process]

The sheet substrate FB which has been fed from the supply roll RL first undergoes a partition wall forming process in which the partition walls BA are formed on the sheet substrate FB. In the partition wall forming process, the sheet substrate FB is pressed (imprinted; impressed) by an imprint roller 10, and the sheet substrate FB is heated by a heat transfer roller 15 to the glass transition point or more so that the pressed partition walls BA are able to maintain their shape. As a result of this, the mold shape formed on the roller surface of the imprint roller 10 is transferred onto the sheet substrate FB.

Figure 2A:
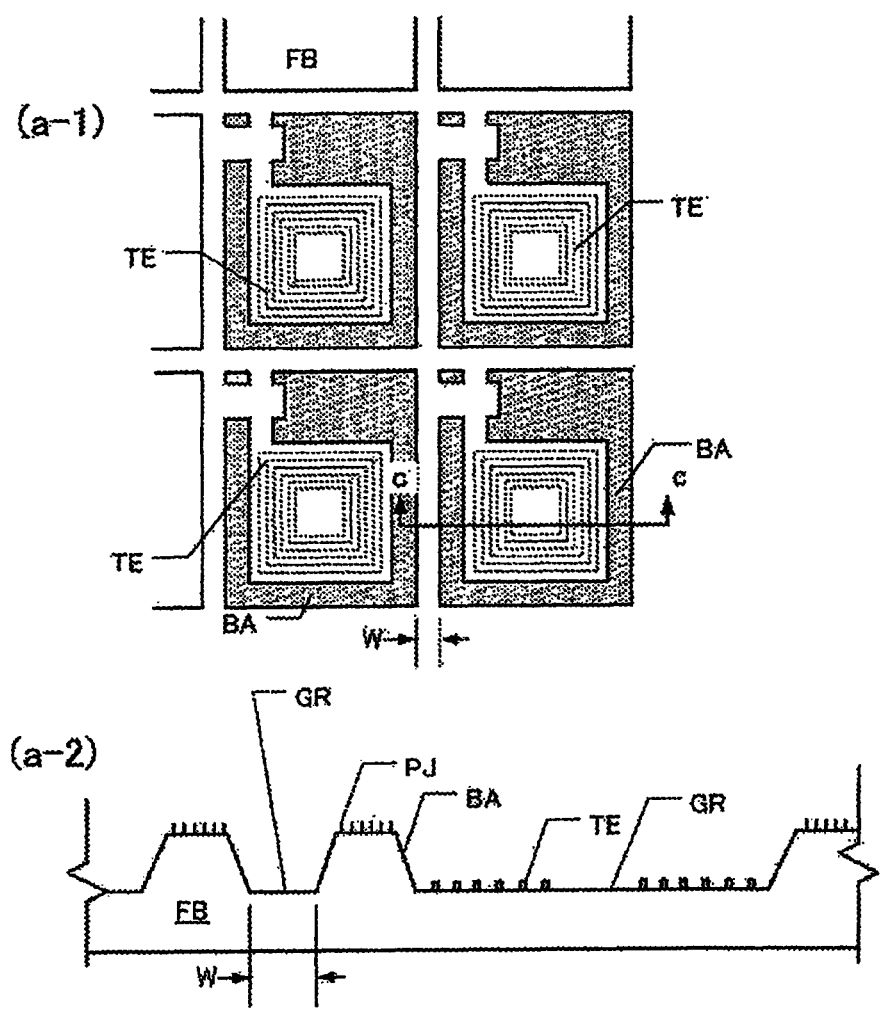
FIG. 2A (a-1) is a top view showing a state in which partition walls are formed by pressing a sheet substrate FB using an imprint roller 10.

The roller surface of the imprint roller 10 is mirror-finished, and a fine imprint mold 11 which is made from a material such as SiC or Ta or the like is mounted on this roller surface. The fine imprint mold 11 has a stamper for thin-film transistor wiring and a stamper for display pixels. In addition, in order to form alignment marks AM and BM (see FIG. 8) on both sides in the width direction of the belt-shaped flexible sheet substrate FB, the fine imprint mold 11 also has a stamper for the alignment marks AM and BM. Note that FIG. 2A shows a sheet substrate FB on which partition walls BA for thin-film transistor wiring and for color filters are formed.

[Electrode Forming Process]

The sheet substrate FB continues to travel in the X-axial direction and undergoes an electrode forming process.

The thin-film transistors (1) may employ either inorganic semiconductor based or organic semiconductor. The thin-film transistors can be formed by employing printing technology or droplet applying technology, if the thin-film transistors are formed using organic semiconductors.

Among thin-film transistors which use organic semiconductors, field effect transistors (FET) are particularly preferable. The electrode forming process shown in FIG. 1 is described using an FET bottom gate type organic EL element 50. After a gate electrode G, a gate insulating layer I, a source electrode S, a drain electrode D, and a pixel electrode P have been formed on the sheet substrate FB, an organic semiconductor layer OS is formed thereon.

In the electrode forming process, the droplet applying apparatus 20 is used. An inkjet method or a dispenser method droplet applying apparatus 20 can be used. Examples of an inkjet method include an electrification control method, a pressure vibration method, an electrical-mechanical conversion method, an electrical heat conversion method, an electrostatic absorption method, and the like. A droplet applying method has a minimum amount of waste of the materials used and can accurately applies a desired quantity of material in a desired position. Hereinafter, the droplet applying apparatus 20 for the gate electrode G is differentiated as gate droplet applying apparatus 20G in which G is added to the end thereof. The same applies for the other droplet applying apparatuses 20. Note that the quantity of one droplet of metal ink MI which is applied using this droplet applying method is between, for example, 1 and 300 nanograms.

Figure 2B:
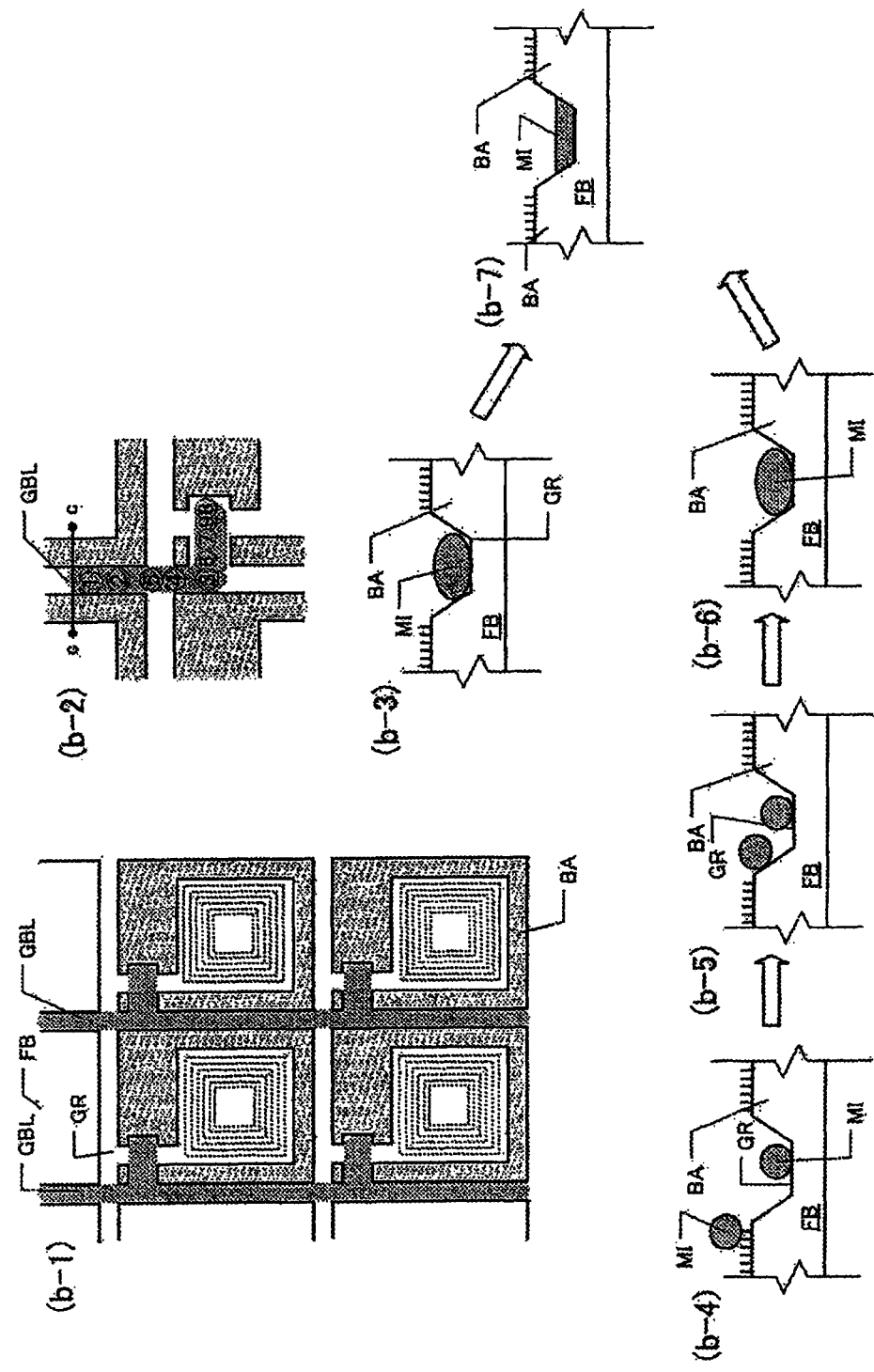
FIG. 2B (b-1) is a top view in which a gate electrode G has been formed.

The gate droplet applying apparatus 20G applies the metal ink MI inside the partition walls BA of a gate bus line GBL. The metal ink MI is then dried or baked using warm air or radiant heat such as far infrared rays by a heat processing apparatus BK. The gate electrode G is formed as a result of those processing. The metal ink MI is a liquid in which conductive bodies having a grain diameter of approximately 5 nm have been stabilized and dispersed in a solvent which is at room temperature, and carbon, silver (Ag), or gold (Au) or the like is used for the conductive bodies. The state in which the gate electrode G has been formed is shown in FIG. 2B (b-1).

Figure 2C:
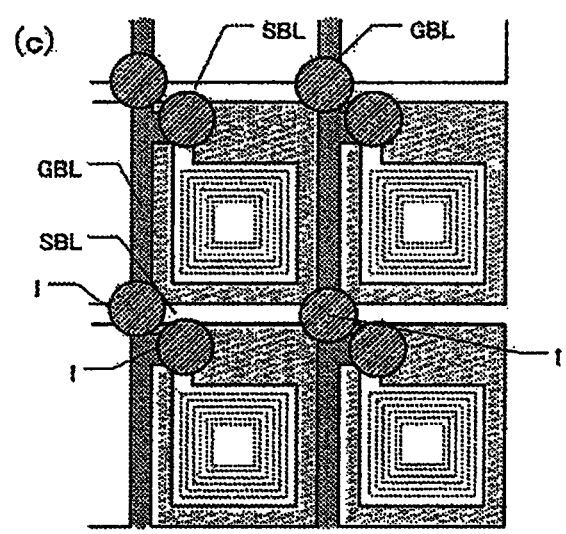
FIG. 2C is a view showing a state in which an insulating layer I is formed by an insulating layer droplet applying apparatus 20I.

Next, an insulating layer droplet applying apparatus 20I applies an electrical insulating ink which is formed from a polyimide based resin or urethane based resin onto switching portions. The electrical insulating ink is then dried and cured using warm air or radiant heat such as far infrared rays by the heat processing apparatus BK. The gate insulating layer I is formed as a result of those processing. A state in which the gate insulating layer I has been formed is shown in FIG. 2C.

Figure 2D:
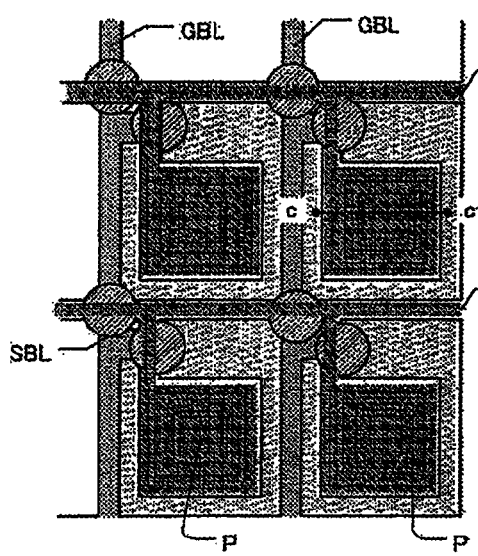
FIG. 2E (e-1) is a view showing a state in which spaces between source electrodes S and drain electrodes D are cut by a cutting apparatus 30.
FIG. 2F (f-1) is a top view in which a light emitting layer IR is formed on a pixel electrode P.
Figure 2D:
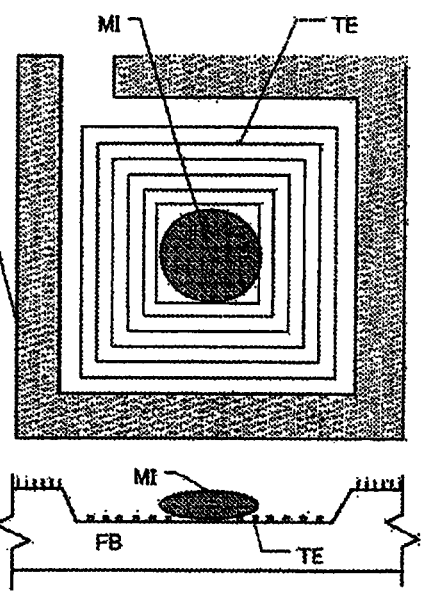
Figure 2D:
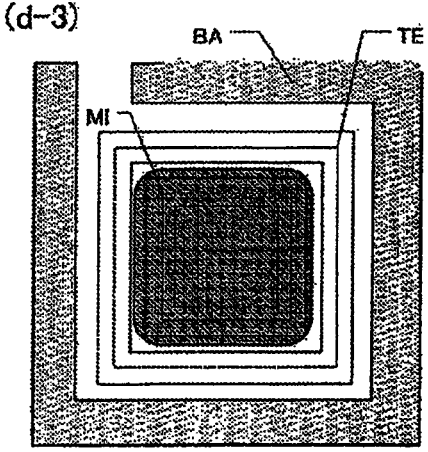
Figure 2D:
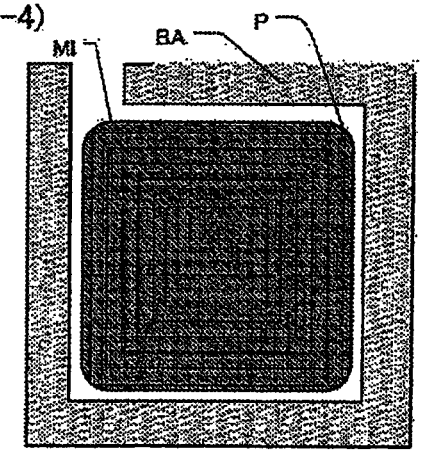

Next, a droplet applying apparatus 20SD for source, drain, and pixel electrodes (source, drain, and pixel electrodes droplet applying apparatus 20SD) applies the metal ink MI inside the partition walls BA of a source bus line SBL and inside the partition walls BA of the pixel electrodes P. The metal ink MI is then dried or baked by the heat processing apparatus BK. An electrode in which a source electrode S, a drain electrode D, and a pixel electrode P are connected is formed as a result of those processing. States in which the source electrode S, drain electrode D, and pixel electrode P have been formed are shown in FIG. 2D.

Next, the source electrodes S and drain electrodes D which are mutually connected are cut by a cutting apparatus 30. A femtosecond laser is preferably used as the cutting apparatus 30. An irradiation portion of the femtosecond laser which uses a titanium sapphire laser irradiates laser light LL having a wavelength of 760 nm in pulses of 10 kHz through 40 kHz. By rotating a galvanometer mirror 31 which is located on the optical path of the laser light LL, the irradiation position of the laser light LL is changed.

Figure 2E:
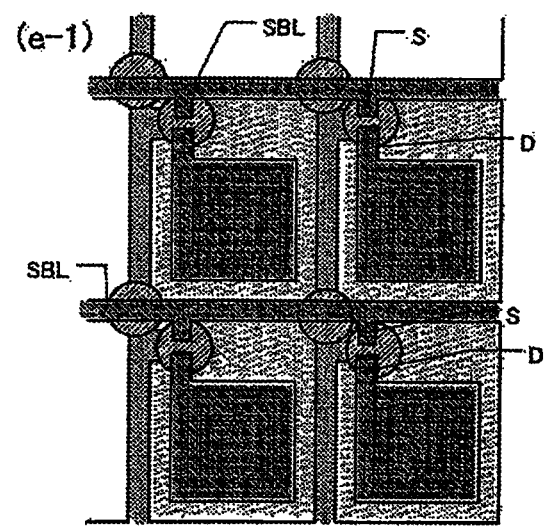
Figure 2E:
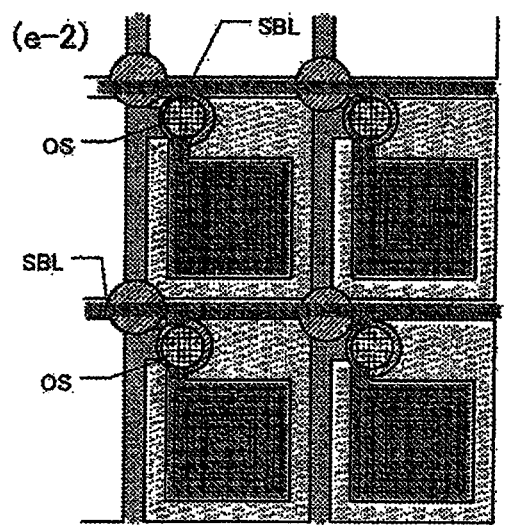

Because the cutting apparatus 30 uses a femtosecond laser, a processing in a sub micron order is possible, and the cutting apparatus 30 can accurately cut the spaces between the source electrodes S and drain electrodes D which determine the performance of a field effect transistor. The spaces between the source electrodes S and drain electrodes D are between approximately 20 μm and 30 μm. As a result of this cutting processing, electrodes in which the source electrodes S and drain electrodes D are separated are formed. A state in which the source electrode S and the drain electrode D are separated is shown in FIG. 2E (e-1).

In addition to a femtosecond laser, it is also possible to use a carbon dioxide gas laser or a green laser or the like. Moreover, it is also possible to perform the cutting mechanically using a dicing saw or the like other than the laser.

Next, an organic semiconductor droplet applying apparatus 20OS applies organic semiconductor ink in switching portions between the source electrodes S and the drain electrodes D. The organic semiconductor ink is then dried or baked using warm air or radiant heat such as far infrared rays by the heat processing apparatus BK. The organic semiconductor layer OS is formed as a result of this processing. A state in which the organic semiconductor layer OS has been formed is shown in FIG. 2E (e-2).

Note that the compounds used to form the organic semiconductor ink may be monocrystalline materials or amorphous materials, and may be either low molecular or high molecular compound. Particularly preferable examples include single crystals or π-conjugated high molecules of annelated aromatic hydrocarbon compounds typified by pentacene, triphenylene, anthracene, and the like.

As is described above, even without using what is known as a photolithographic process, it is possible to form thin-film transistors and the like by employing printing technology or droplet applying technology. If only printing technology or droplet applying technology is used, then because of bleeding or spreading of the ink, it is not possible to form a thin-film transistor or the like accurately. However, because the partition walls BA are formed by a partition wall forming process, the ink is prevented from bleeding or spreading. Moreover, the space between the source electrodes S and drain electrodes D which determine the performance of the thin-film transistor can be formed by laser processing or mechanical processing.

The belt-shaped flexible sheet substrate FB on which the thin-film transistors and pixel electrodes P are formed may be wound onto the wind-up roll RE and the processing temporarily ended, or it may immediately undergo the subsequent light emitting layer forming process, as is shown in the bottom portion in FIG. 1. Note that in the case when the temporary winding-up is performed, it is preferable for slip sheet or the like to be wound up at the same time that this winding-up is performed in order to provide a cushion layer to protect the formed electrodes.

[Light Emitting Layer Forming Process]

Next, the manufacturing apparatus 100 of organic EL element performs a process to form a light emitting layer IR of the organic EL element on the pixel electrode P.

In this light emitting layer forming process, the droplet applying apparatus 20 is used. As is described above, either an inkjet method or a dispenser method can be employed.

The light emitting layer IR contains a host compound and a phosphorescent compound (also known as a phosphorescent light emitting compound). The host compound is the compound which is contained in the light emitting layer. The phosphorescent compound is a compound in which the light emission from excited triplets can be observed, and which emits phosphorescent light at room temperature.

A droplet applying apparatus 20Re for a red light emitting layer applies R solution onto the pixel electrode P so as to form a film whose thickness after drying is approximately 100 nm. The R solution is a solution obtained by dissolving the polyvinylcarbazole (PVK) host material and a red dopant material in 1,2-dichloroethane.

Next, a droplet applying apparatus 20Gr for a green light emitting layer applies G solution onto the pixel electrode P. The G solution is a solution obtained by dissolving the PVK host material and a green dopant material in 1,2-dichloroethane.

Furthermore, a droplet applying apparatus 20BL for a blue light emitting layer applies B solution onto the pixel electrode P. The B solution is a solution obtained by dissolving the PVK host material and a blue dopant material in 1,2-dichloroethane.

Thereafter, the light emitting layer solutions are dried and cured using warm air or radiant heat such as far infrared rays by the heat processing apparatus BK. A state in which the light emitting layer IR has been formed is shown in FIG. 2R.

Next, an insulating layer droplet applying apparatus 20I applies an electrical insulating ink formed from a polyimide based resin or a urethane based resin on a portion of the gate bus line GBL or source bus line SBL such that there is no short-circuiting between these and a transparent electrode ITO (described below). The electrical insulating ink is then dried and cured using warm air or radiant heat such as far infrared rays by the heat processing apparatus BK.

Next, an ITO electrode droplet applying apparatus 20IT applies an ITO (indium tin oxide) ink on top of the red, green, and blue light emitting layers. The ITO ink is a compound which is formed by adding several percent of tin oxide ($SnO_2$) to indium oxide ($In_2O_3$), and the resulting electrode is transparent. It is also possible to use an amorphous material such as IDIXO ($In_2O_3$—ZnO) which can manufacture a transparent conductive film. The transparent conductive film preferably has a transmittance of 90% or more. The ITO ink is then dried and cured using warm air or radiant heat such as far infrared rays by the heat processing apparatus BK. A state in which an insulating layer I and an ITO electrode have been formed on a gate bus line GBL is shown in FIG. 3(a).

In FIG. 3(a), in order to make it easier to understand, the insulating layer I is drawn in a circular shape that extends beyond the partition walls BA. However, it is not necessary for it to extend beyond the partition walls BA, and it is sufficient if the electrical insulating ink is applied on the gate electrode G through which the source bus line SBL passes. Moreover, the organic EL element 50 is completed with the transparent electrode ITO in a applied state.

Note that there also are cases when the organic EL element 50 is provided with a positive hole transporting layer and an electron transporting layer, and printing technology or droplet applying technology may also be applied when forming these layers.

[[Organic EL Elements 50 Formed in Partition Walls of Field Effect Transistor]]

Figure 2F:
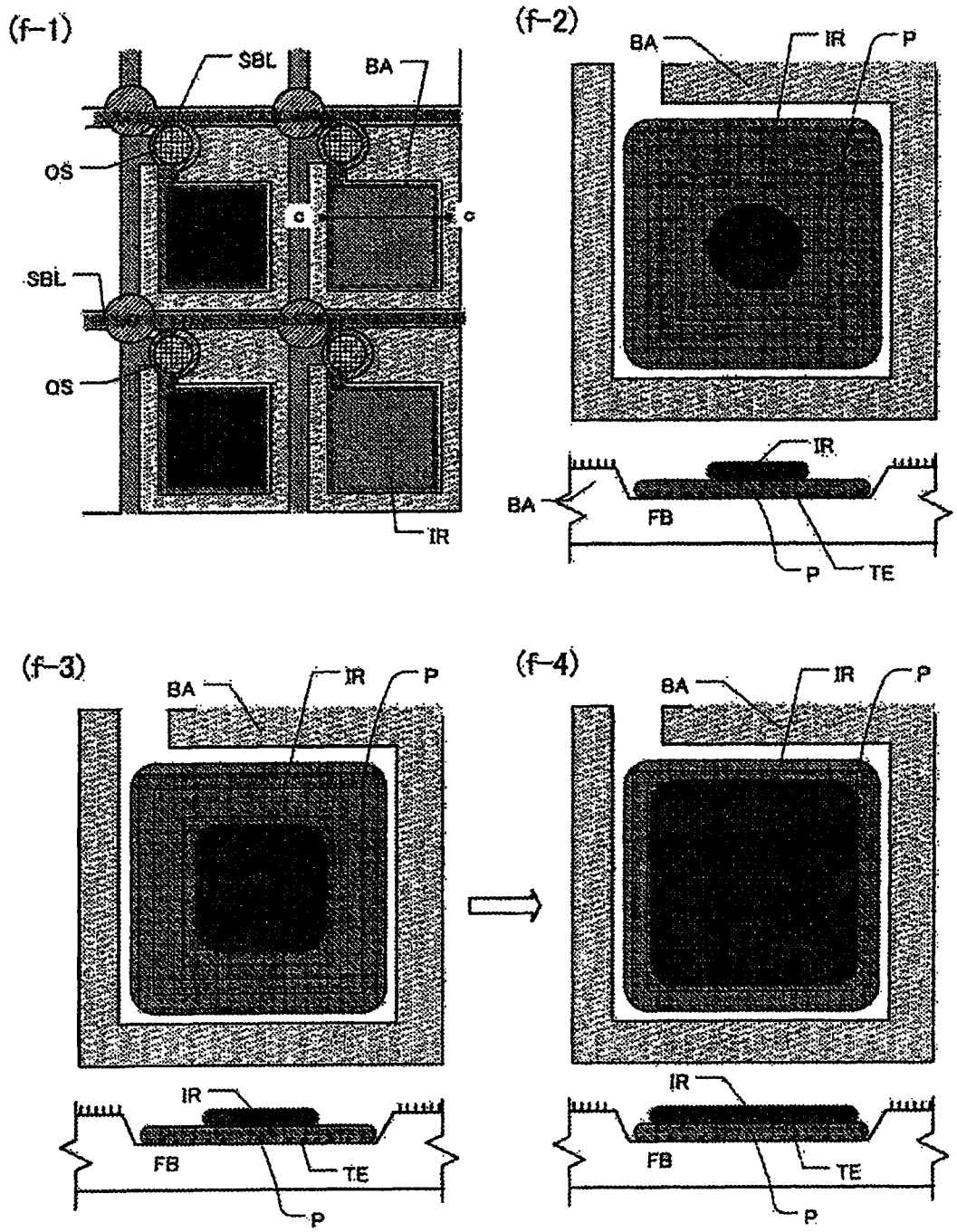
Figure 3:
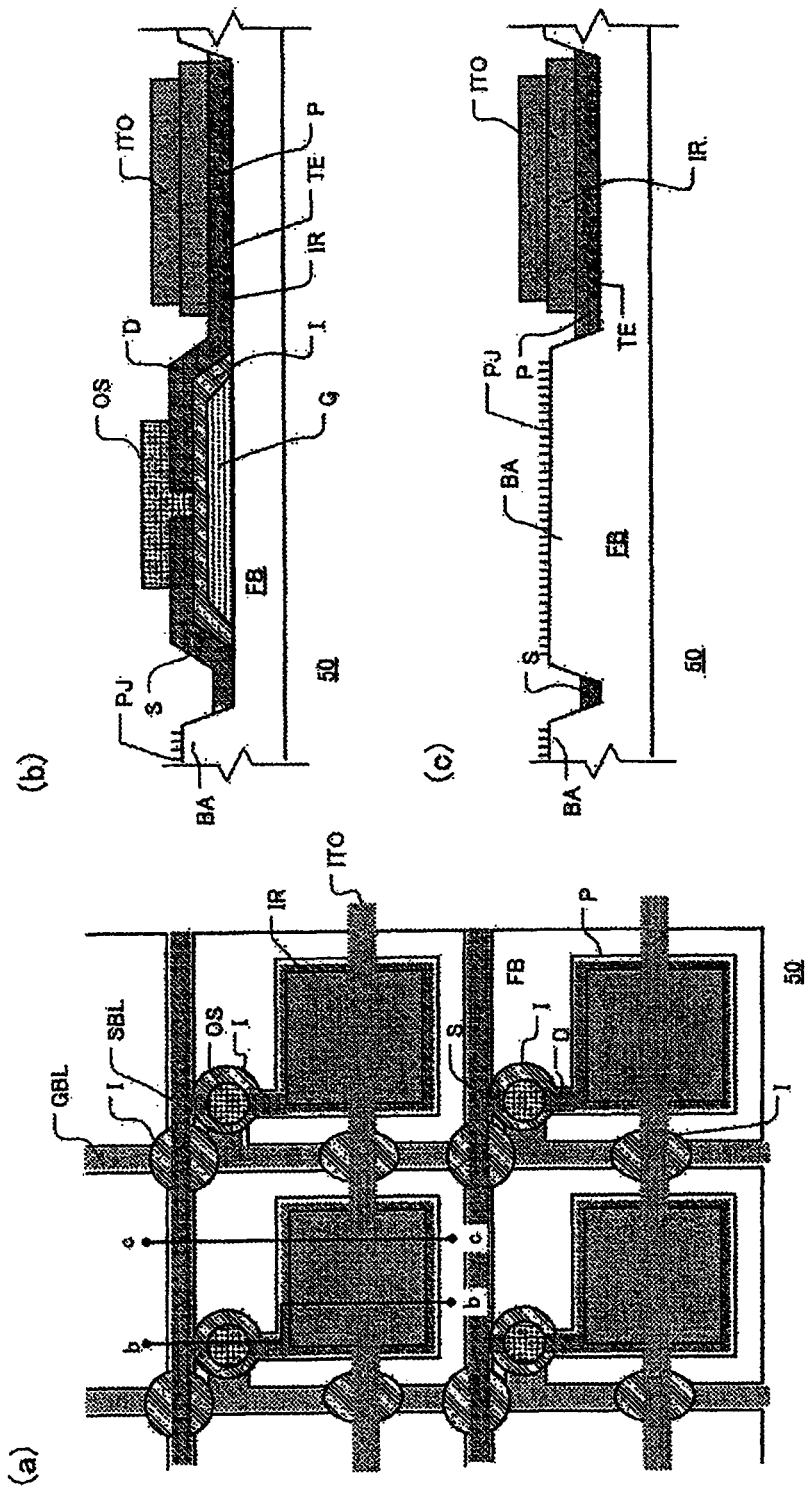
FIG. 3(*a*) is a top view of a light emitting element 50 that is manufactured by the organic EL element manufacturing apparatus 100 shown in FIG. 1.

FIG. 3 shows a state of a bottom contact type organic EL element on which a light emitting layer IR and an ITO electrode have been formed. The organic EL element 50 has a gate electrode G, a gate insulating layer I, and the pixel electrode P formed on the sheet substrate FB, and the organic semiconductor layer OS, the light emitting layer IR, and the ITO electrode are further formed thereon. Moreover, using FIG. 2A through FIG. 2F, various states during the manufacturing of an organic EL element 50 by the manufacturing apparatus 100 will now be described.

[Structure of the Sheet Substrate FB]

In FIG. 2A and FIG. 3, the sheet substrate FB is formed by a heat resistant resin film. Specifically, polyethylene resins, polypropylene resins, polyester resins, ethylene-vinyl copolymer resins, polyvinyl chloride resins, cellulose resins, polyimide resins, polyimide resins, polycarbonate resins, polystyrene resins, vinyl acetate resins and the like can be used for the sheet substrate FB.

As has been described above, because the sheet substrate FB undergoes heat processing via heat transfer in the partition wall forming process, and the various types of ink must be dried or baked by the heat processing apparatuses BK, the sheet substrate FB is heated to approximately 200 degrees. The sheet substrate FB preferably has a low coefficient of thermal expansion so that the dimensions thereof do not change when it is heated. For example, it is possible to lower the coefficient of thermal expansion by mixing an inorganic filler into the resin film. Examples of this inorganic filler include titanium oxide, zinc oxide, alumina, silicon oxide and the like.

[Lyophobic Function]

FIG. 2A (a-1) is a top view showing a sheet substrate FB which has been printed by the fine imprint mold 11. FIG. 2A (a-2) is a cross-sectional view taken along the line c-c in FIG. 2A (a-1). Note that lyophobic refers to a state in which it is difficult for a liquid which includes water or the like to easily bond with another substance.

In FIG. 2A (a-2), the cross-sectional configuration of the partition walls BA may be an inverted V shape, or may be an inverted U shape, or may be a rectangular shape. However, an inverted V shape or inverted U shape are preferable as they allow the sheet substrate FB to be peeled off easily after the sheet substrate FB has been pressed by the fine imprint mold 11. Note that the groove portion GR is formed between left and right partition walls BA, however, it is also possible for the right partition wall BA and the left partition wall BA to be connected partly along the way. Namely, it is also possible for concavo-convex portions (non-planar portions; projections and recessed portions) to be formed by the fine imprint mold 11 on the sheet substrate FB.

Moreover, a plurality of projections PJ are formed together with the partition walls BA on the top surface of the partition walls BA by the fine imprint mold 11 (a liquid repellency imparting process). The dimensions of these projections PJ are between φ3 μm and φ20 μm with the height thereof being 1 μm through 8 μm. Plurality of these projections PJ are formed at mutual intervals from each other of 6 μm through 40 μm. Distal ends of these projections PJ may be formed in a tapered needle shape, or may be formed in a circular column shape having a non-narrowing diameter. These projections PJ have a lyophobic function and repel droplets.

A width W (μm) of the groove portions GR between the partition walls BA corresponds to the required line width of the gate bus lines GBL and the like and is, for example, approximately 20 μm. A droplet diameter d μpm) of the droplets applied from the gate droplet applying apparatus 20G is preferably from W/2 to W/4.

FIG. 2B (b-2) is a cross-sectional view showing a state in which metal ink MI has been dripped into a groove portion GR between partition walls BA for a gate bus line GBL. The sequence of the applying is controlled such that the gate electrode G is a straight line. The numbers from 1 through 9 in FIG. 2B (b-2) show the applying sequence. This applying order causes the droplets to be in a straight line due to mutual tensile force between the metal ink MI droplets. Basically, the metal ink is applied such that the last droplet is applied in the middle.

FIG. 2B (b-3) is a cross-sectional view taken along a line c-c in FIG. 2B (b-2). By providing the partition walls BA, even when the metal ink MI is applied by the droplet applying apparatus 20, the metal ink MI does not flow out from the gate bus line GBL. The metal ink MI is then dried or baked by the heat processing apparatus BK so that the metal ink MI forms a thin-film such as that shown in FIG. 2B (b-7).

In contrast, as is shown in FIG. 2B (b-4), there is a possibility that the metal ink MI will not be applied inside the groove portions GR and will be applied by mistake on top of the partition walls BA. Because the plurality of projections PJ are formed on the top surface of the projection walls BA, the partition walls BA have a lyophobic function, and any metal ink MI that is applied by mistake on top of the partition walls BA flows down to a lower area along the V-shaped cross-section of the partition walls BA as is shown in FIG. 2B (b-5). As is shown in FIG. 2B (b-6), the metal ink MI then flows into the groove portion GR between the partition walls BA for the gate bus line GBL.

In the present embodiment, the partition walls BA are provided with a lyophobic function via the projections PJ. However, it is also possible to furnish the top surface of the partition walls BA with a lyophobic function using another method.

One of these other methods involves forming a lyophobic coating film on the partition walls BA. Specifically, by forming a fluorine resin film which is formed by using a printing method or the like to print a fluorine resin on the top surface of the partition walls BA, the partition walls BA can be provided with a lyophobic function. A roller which is impregnated with a fluorine resin is installed between the imprint roller 10 and the gate droplet applying apparatus 20G shown in FIG. 1, and as the rollers which are impregnated with this fluorine resin are rotated; they form fluorine resin on the top surface of the partition walls BA. As a result, the partition walls BA can be provided with the same lyophobic function as when they are provided with the plurality of projections PJ. Instead of fluorine resin, it is also possible to use an acrylic silicone based resin.

As another method, the partition walls BA is provided with a lyophobic function by imparting plasma irradiation or ion irradiation on the top surface of the partition walls BA. The plasma irradiation or ion irradiation reforms the top surface of the partition walls BA so that they develop into the same type of surface as when the projections PJ are formed thereon. As a result, the partition walls BA can be provided with the same lyophobic function as when they are provided with the plurality of projections PJ. A plasma irradiation apparatus or ion irradiation apparatus is installed between the imprint roller 10 and the gate droplet applying apparatus 20G shown in FIG. 1, and the projections PJ are formed on the top surface of the partition walls BA. Note that when imparting plasma irradiation or ion irradiation, it is preferable for a protective mask to be placed on the groove portions GR such that plasma or ions are not irradiated, thereon.

[Lyophilic Function]

In addition to providing the top surfaces of the partition walls BA with a lyophobic function, it is preferable for the groove portions GR between the partition walls BA to have a lyophilic function. Note that lyophilic refers to a state in which it is easy for a liquid which includes water or the like to bond easily with another substance.

Specifically, if the sheet substrate FB is provided with an ethylene base (—$CH_2$—$CH_2$—), it is possible to provide the groove portions GR with a lyophilic function by irradiating an excimer laser XE or an excimer xenon lamp XL on to the groove portions GR. By removing one hydrogen atom from the ethylene base, the surface of the groove portions GR is reformed so that the groove portions GR are provided with a lyophilic function. Ultraviolet lights having a wavelength of approximately 180 nm are irradiated by an excimer laser XE or an excimer xenon lamp XL between the imprint roller 10 and the gate droplet applying apparatus 20G shown in FIG. 1, a lyophilic function is formed on the top surface of the groove portions GR (a liquid affinity imparting process).

Moreover, by using an appropriate gas atmosphere, it is possible to provide a lyophilic function on fluorine resin via ultraviolet irradiation. A strong lipophilic property can be obtained by irradiating ultraviolet light having a wavelength of approximately 180 nm in a B $(CH_3)_3$ gas atmosphere. It is also possible to use Al $(CH_3)_3$ instead of B $(CH_3)_3$. Furthermore, it is also possible to obtain strong hydrophilic properties by using a gas mixture of $NH_3$ and $B_2H_6$.

Moreover, even if in the case when the substrate does not have an ethylene base, it is also possible that form a high molecular thin-film of PVA (polyvinyl alcohol) or the like by a spray method or the like, and reform the surface from a hydrophobic surface to a lyophilic surface by irradiating ultraviolet light thereon. As the light source, it is also possible to use a third harmonic YAG laser (wavelength of 355 nm) or a fourth harmonic YAG laser (wavelength of 266 nm) instead of the excimer laser XE or excimer xenon lamp XL. The method used to form this lyophilic function is described in FIG. 4 through FIG. 6.

[Patterns which Control Wet Spreading]

FIG. 2D (d-1) is a top view showing a state in which metal ink MI is supplied to the groove portions GR between partition walls BA for source bus lines SBL, drain electrodes D, and pixel electrodes P. FIGS. 2D (d-2) through 2D (d-4) are top views and cross-sectional views showing enlargements of the groove portions GR for a pixel electrode P.

A plurality of textures TE are formed on the surface of the groove portions GR as patterns that control wet spreading of the droplets. The plurality of textures TE are formed by the fine imprint mold 11 together with the partition walls BA. The dimensions of these textures TE are a width of between 0.5 μm and 2 μm and a height of between 0.1 μm and 2 μm. It is not preferable for the height of the textures TE to be 4 μm or more as this causes them to have a lyophobic function. In the present embodiment, because the pixel electrodes P are rectangular, the shape of the textures TE is also a rectangular shape. The textures TE have a function of causing the metal ink MI to wet-spread in conformance with the shape of the textures TE. Normally, droplets such as the metal ink MI and the like spread out in a circular shape due to surface tension, however, these droplets spread in a rectangular shape so as to conform to the shape of the textures TE.

Specifically, as is shown in FIG. 2D (d-2), the droplet applying apparatus 20SD applies the metal ink MI in the center of the groove portions GR of the pixel electrodes P. As it continues to apply the metal ink MI in the center of the groove portions GR of the pixel electrodes P, as is shown in FIG. 2D (d-3), the metal ink MI spreads out in a rectangular shape. As is shown in FIG. 2D (d-4), once a suitable size has been reached for the pixel electrode P, the applying by the droplet applying apparatus 20SD is stopped. The heat processing is then performed by the heat processing apparatus BK and the rectangular pixel electrode P is completed.

Although not shown in the present embodiment, it is also possible to form the textures TE which extend in a line relative to the gate bus line GBL, the source bus line SBL, and the drain electrode D using the fun; imprint mold 11. If the sheet substrate FB combines the textures TE with the above described lyophilic function, then the metal ink MI spreads to a uniform height.

FIG. 2F (f-1) is a top view showing a state in which red, green, and blue light emitting layers IR are formed on a pixel electrode P. FIGS. 2F (f-2) through 2F (f-4) are top views and cross-sectional views showing the light emitting layer IR being formed on the pixel electrode P.

The textures TE are hidden by the pixel electrode P and do not appear directly on the surface, however, the shapes of the textures TE do stand out slightly on the surface of the pixel electrodes P which have undergone the heat processing. Because of this, droplets of an R solution, a B solution, and a G solution for the light emitting layer spread in a rectangular shape so as to conform to the shape of the textures TE which are formed on the surface of the pixel substrate P.

Specifically, as is shown in FIG. 2F (f-2), the droplet applying apparatus 20Re, the droplet applying apparatus 20Gr, and the droplet applying apparatus 20BL apply the R solution, the B solution, and the G solution in the center of the pixel electrodes P. As they continue to apply the R solution, the B solution, and the G solution in the center of the pixel electrodes P, as is shown in FIG. 2F (f-3), the R solution, the B solution, and the G solution spread out in a rectangular shape. As is shown in FIG. 2F (f-4), once a suitable size has been reached for the light emitting layer IR, the applying is stopped. Heat processing is then performed and the rectangular light emitting layer IR is completed.

Thereafter, because the shapes of the textures TE also stand out slightly from the surface of the rectangular light emitting layer IR which has undergone heat processing when the transparent electrode ITO is being applied by the droplet applying apparatus 20IT as well, the transparent electrode ITO is also formed in a rectangular shape.

As a result of the above processing, the organic EL element 50 shown in FIG. 3 (*a*) is completed. As is shown in FIG. 3(*b*)

and FIG. 3(c), by providing partition walls BA with the projections PJ which have a lyophobic function, and by providing groove portions GR which have an affinity function (lyophilic function) and which have the textures TE, it is possible to form electrodes and light emitting layers accurately and uniformly. Because the sheet substrate FB is fed at high speed in the X-axial direction (i.e., the longitudinal direction) by the rollers RR, there is a possibility that the droplet applying apparatus 20 will not be able to accurately apply droplets. Even in such cases as these, electrodes and light emitting layers can be formed accurately and uniformly.

[Method for Forming a Lyophilic Function]

Figure 4:
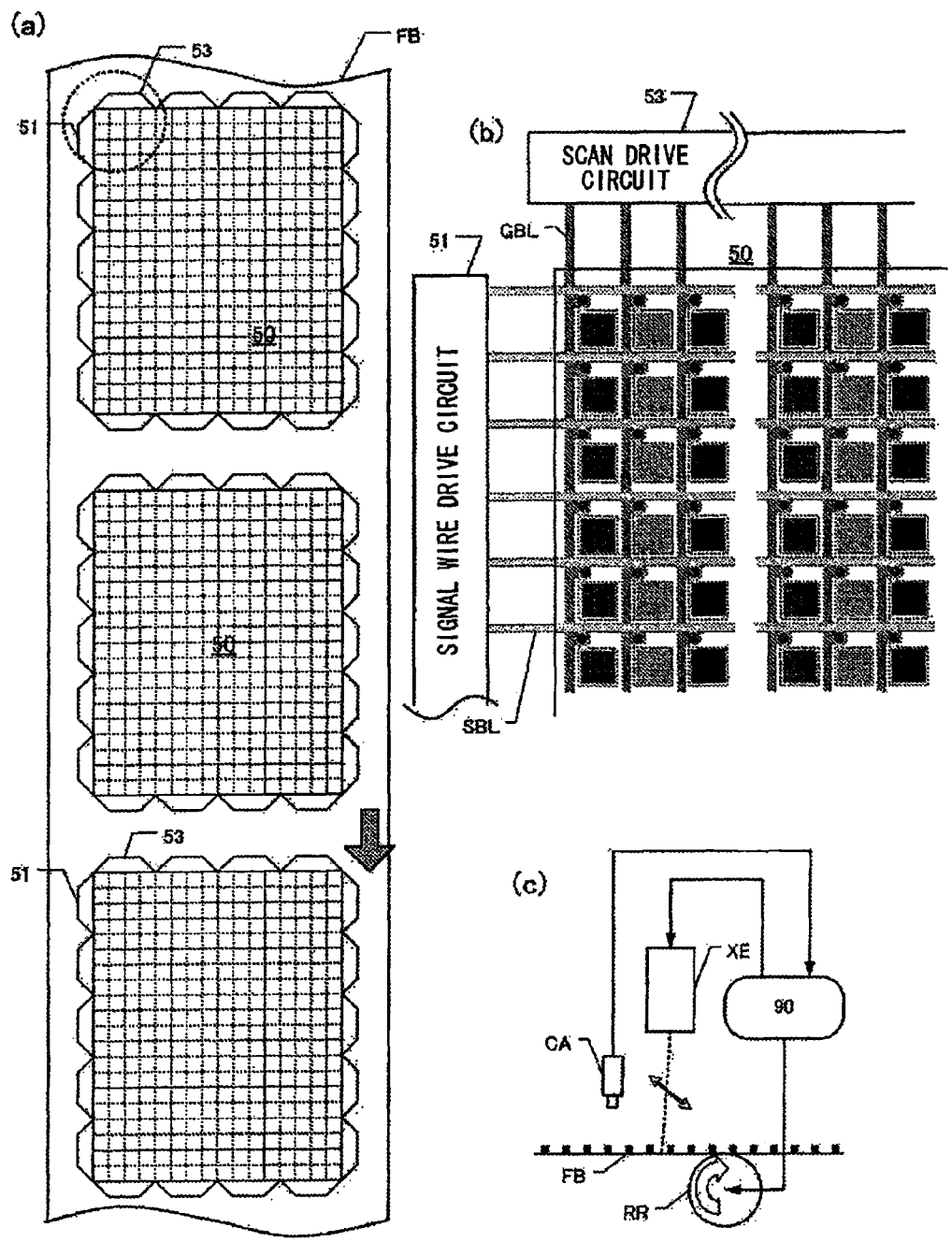
FIG. 4 is a view showing a method in which direct rendering is performed by a laser light source such as an excimer laser XE or a YAG higher harmonic laser so as to form a lyophilic function.

FIG. 4 shows a method in which a lyophilic function is formed using a laser light source such as an excimer laser XE or a YAG harmonic laser. FIG. 4(a) shows a sheet substrate FB containing all of the organic EL elements 50 which include drive circuits, and FIG. 4(b) is an enlarged view showing the interior of the secular portion shown in FIG. 4(a).

As is shown in FIG. 4(a) and FIG. 4(b), organic EL elements 50 are located in the center of the sheet substrate FB, and signal wire drive circuits 51 and scan drive circuits 53 are provided on outer circumferential portions thereof. Source bus lines SBL are connected to the signal wire drive circuits 51, and these source bus lines SBL are provided for each one of the organic EL elements 50. In addition, gate bus lines GBL are connected to the scan drive circuits 53, and these gate bus lines GBL are provided for each one of the organic EL elements 50. Moreover, common electrodes and the like (not shown) are also provided in the organic EL elements 50.

Peripheral portions of the sheet substrate. FB containing all of the organic EL elements 50 may have a comparatively larger line width compared to that of the organic EL elements 50. Because of this, even if partition walls BA, in particular, are not provided for the signal line drive circuits 51 and scan drive circuits 53, there is no obstruction caused just by the metal ink MI being applied by the droplet applying apparatus 20.

FIG. 4(c) is a conceptual view in which a lyophilic function is formed using a laser light source such as an excimer laser XE or a YAG harmonic laser. A main control unit 90 receives detection results for alignment marks AM and BM from an alignment camera CA, and controls the irradiation timings of the laser light. The laser light source renders the laser light onto the sheet substrate FB by oscillating it to the left and right and forwards and backwards based on control signals from the main control unit 90. As is described above, because the signal wire drive circuits 51 and scan drive circuits 53 have a comparatively large line width, they are suited to the formation of a lyophilic function that is based on the rendering of a laser light source.

Figure 5:
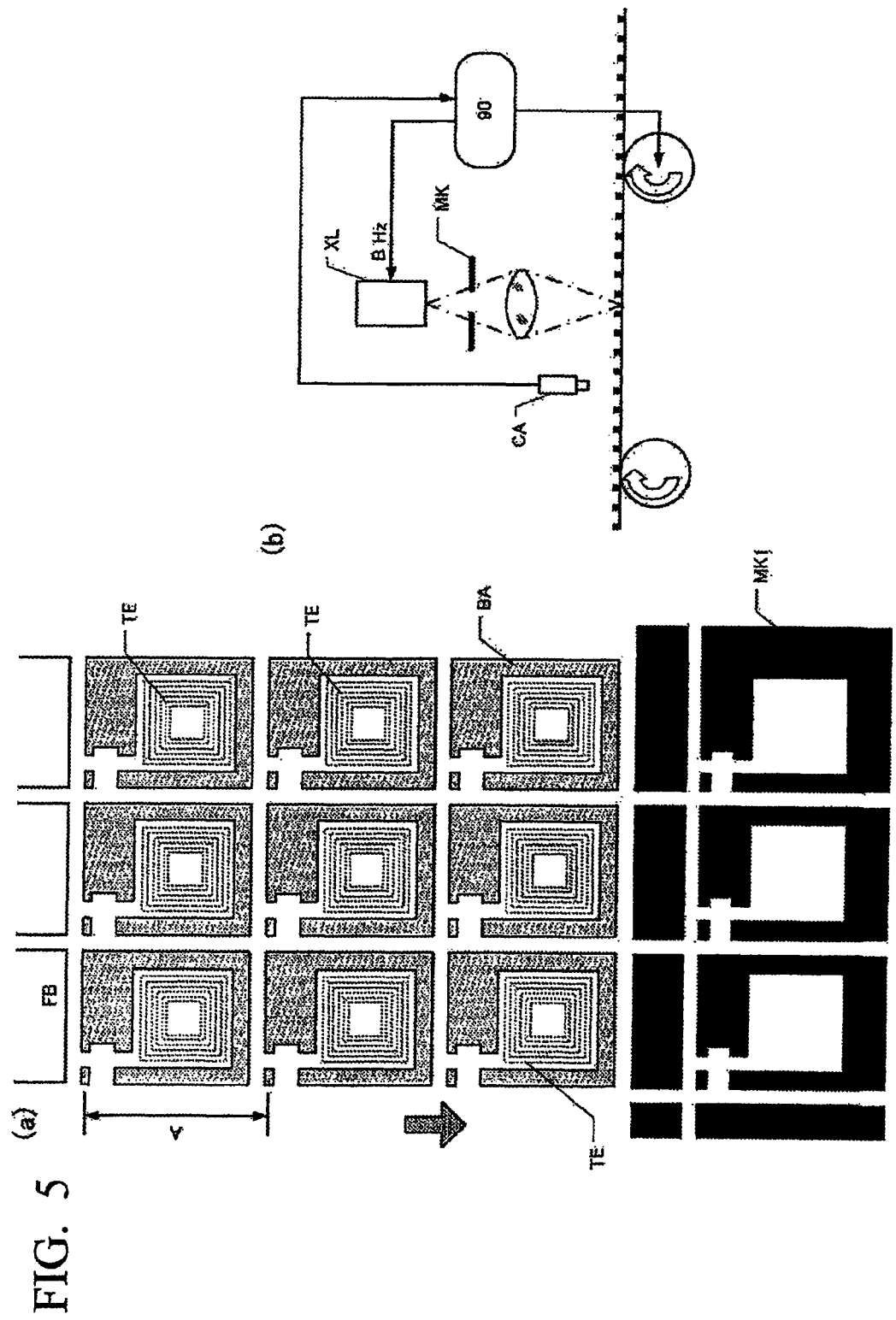
FIG. 5 is a view showing a method of forming a lyophilic function using ultraviolet rays and a single mask MK.

FIG. 5 shows a method in which a lyophilic function is formed using a light source such as an excimer laser XE or an excimer xenon lamp XL and a mask MK. FIG. 5(a) is a view illustrating a method in which a lyophilic function is formed on the sheet substrate FB after the formation of the partition walls BA described in FIG. 2A. FIG. 5 (b) is a conceptual view in which a lyophilic function is formed using an excimer laser XE or an excimer xenon lamp XL and a mask MK.

When the pattern of the organic EL elements 50 is fine or complex, there is a remarkable drop in throughput if a laser light source rendering method is used for all of them. In cases such as this, exposure using a mask MK is suitable as it allows throughput to be improved.

FIG. 5(a) shows the installation of a first mask MK1 which is used for the metal ink MI. The first mask MK1 has a pattern which has a periodicity of between one and several lines. The first mask MK1 has an aperture that allows ultraviolet rays having a wavelength of approximately 180 nm to be irradiated in a single operation onto an area where all of the metal ink MI is to be applied. Moreover, the first mask MK1 blocks the ultraviolet rays from being irradiated onto the partition walls BA.

The sheet is exposed by the ultraviolet rays using a proximity method in which the first mask MK1 is positioned close to the sheet substrate FB or a projection method which uses a projection optical system such as the lens shown in FIG. 5(b). The projection method allows a large space to be left open between the mask MK and the sheet substrate FB, and makes it possible to improve the yield and obtain increased miniaturization. By causing the light source such as the excimer laser XE or excimer xenon lamp XL to flash in synchronization with the movement speed of the sheet substrate FB, the pattern on the first mask MK1 is exposed onto the sheet substrate FB. The excimer laser XE, flash lamp, or YAG harmonic laser or the like have a flash time of several tens of nanoseconds to several hundreds of nanoseconds. Consequently, even if the exposure is made with the mask MK in a stationary state relative to the moving sheet substrate FB, there is substantially no occurrence of image deletion or the like. Accordingly, a lyophilic function is accurately formed in exposed locations.

Specifically, if the movement speed of the sheet substrate FB is set to be v, the pixel pitch of the organic EL elements in a longitudinal direction is set to be A, and the pulse frequency of the excimer xenon lamp XL is set to be B, then a relationship $v = A \times B$ is established. For example, when the pixel pitch $A = 0.1$ mm, it is sufficient for the main control unit 90 to set the movement speed v of the sheet substrate FB to 500 mm/sec, and the pulse frequency B to 5 kHz.

Note that, in accordance with the location of the organic EL element 50, it is also possible to use the mask MK or to perform direct laser rendering, or to use both together.

Figure 6A:
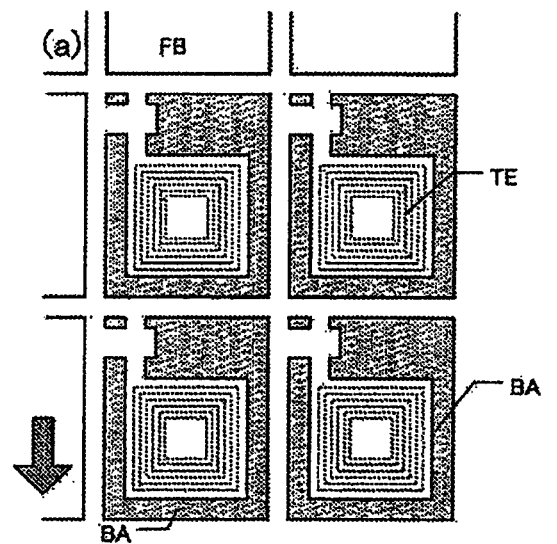
FIG. 6A is a view showing a method of forming a lyophilic function using ultraviolet rays and a plurality of masks MK.
Figure 6A:
Figure 6A:
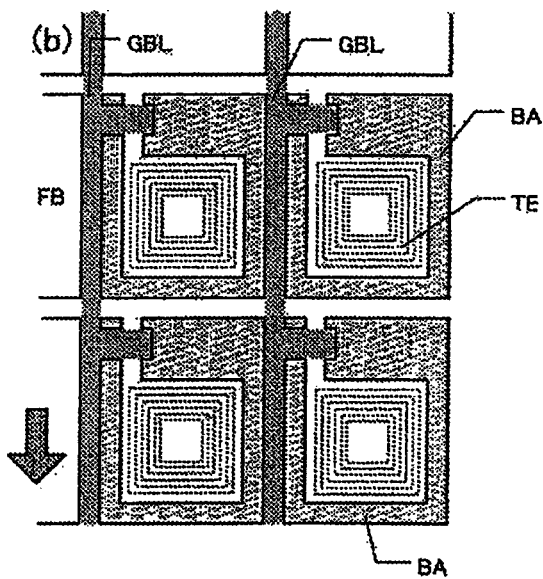
Figure 6B:
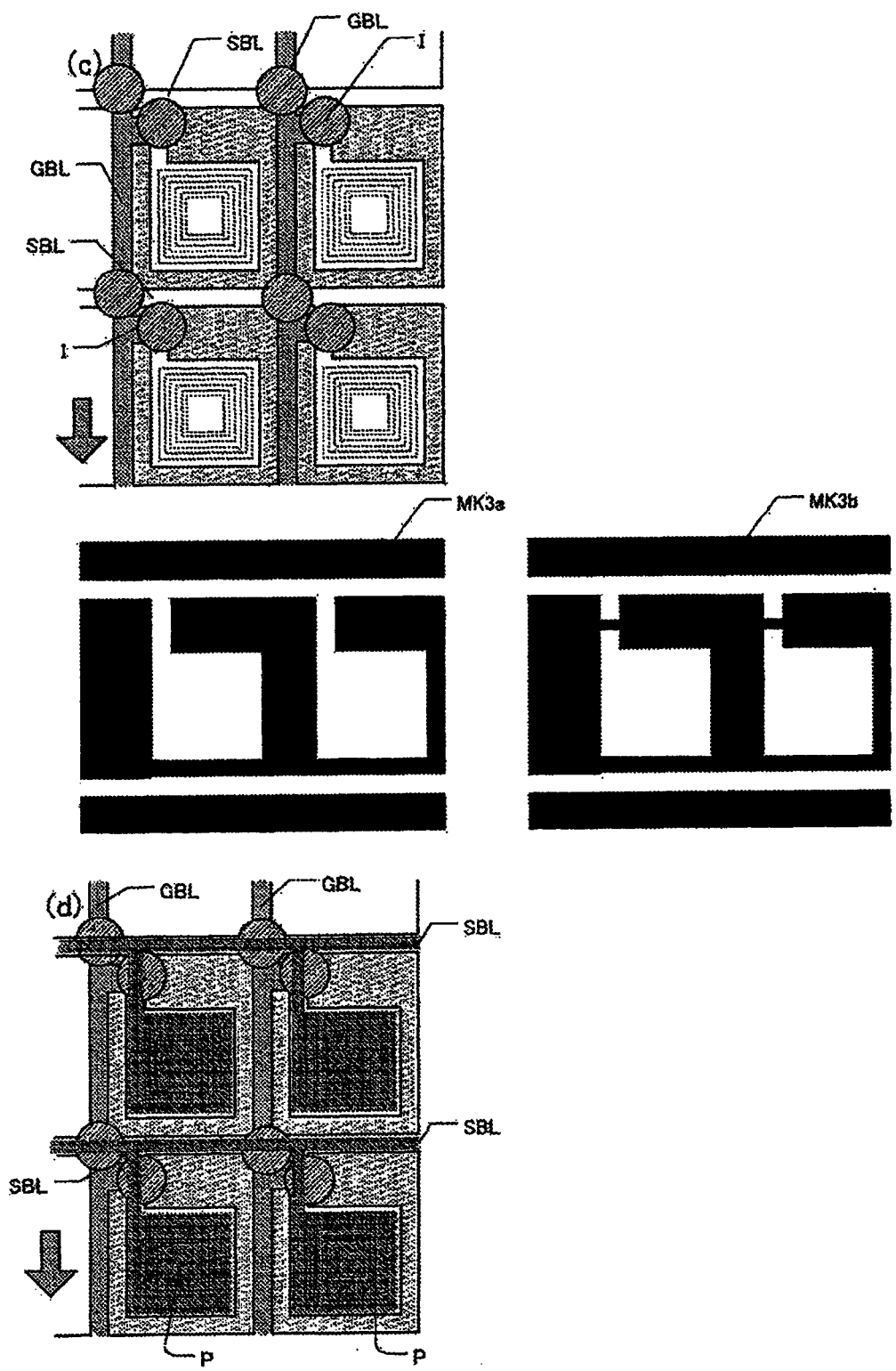
FIG. 6B is a view showing a method of forming a lyophilic function using ultraviolet rays and a plurality of masks MK.
Figure 6C:
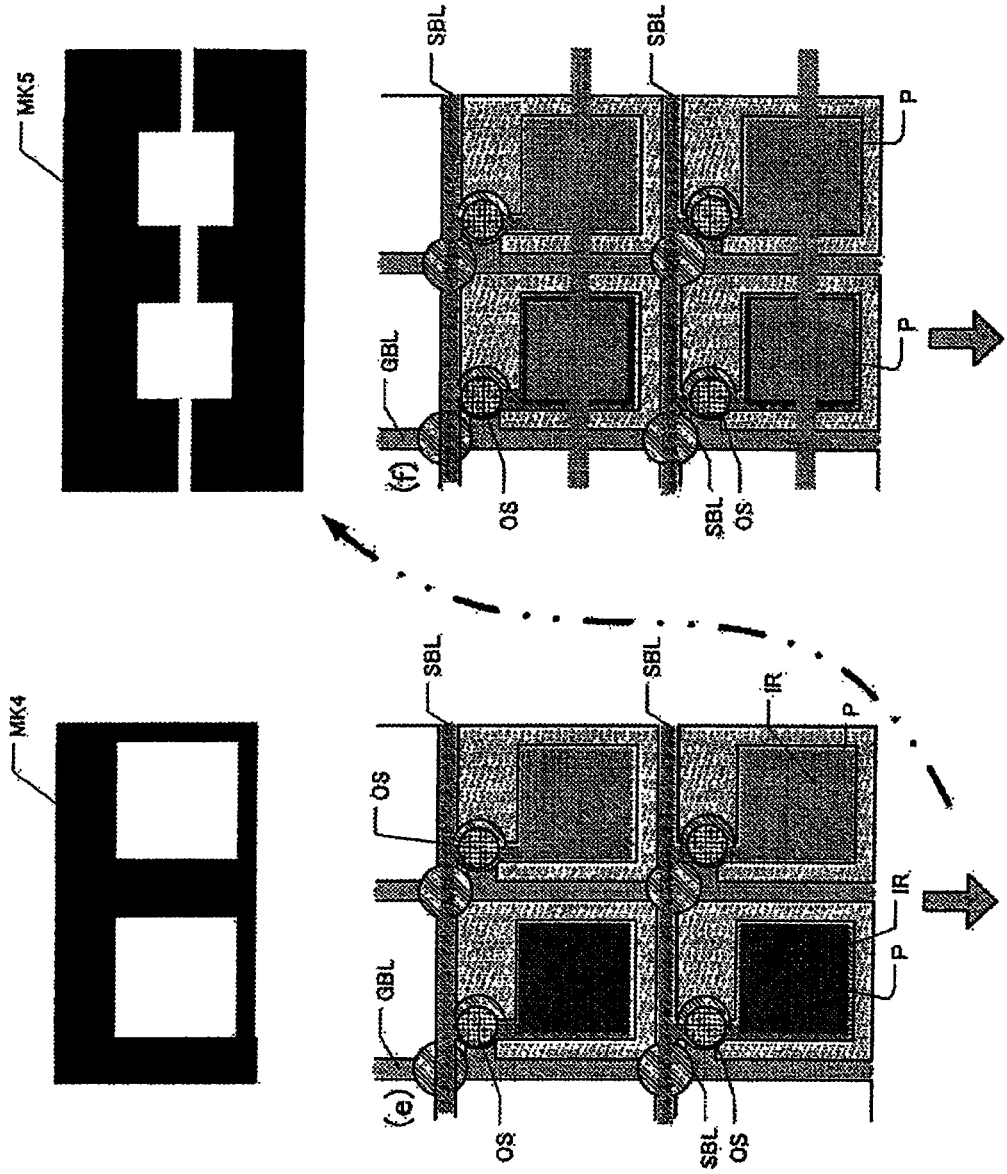
FIG. 6C is a view showing a method of forming a lyophilic function using ultraviolet rays and a plurality of masks MK.

FIG. 6A through FIG. 6C show a method in which a lyophilic function is formed using a light source such as an excimer laser XE or an excimer xenon lamp XL and a plurality of masks MK.

FIG. 6A (a) shows a method in which a second mask MK2 which forms a hydrophilic function is formed only on the gate bus line GBL on the sheet substrate FB after the partition walls BA described in FIG. 2A have been formed thereon. An aperture that corresponds to the gate bus line GBL is formed in the second mask MK2, and light is blocked from all other areas thereof. Exposure can be achieved using a structure such as that shown in FIG. 5(b). Because a lyophilic function has been formed, if the metal ink MI is then applied by the droplet applying apparatus 20G as is shown in FIG. 6A (b), the gate bus line GBL is formed accurately.

Next, FIG. 6B (c) shows a state in which the gate insulating layer I described in FIG. 2C is formed, and shows a state in which a third mask MK3a or MK3b which forms a hydrophilic function only on the source bus line SBL and pixel electrode P is applied to the sheet substrate FB in this state.

An aperture that corresponds to the source bus line SBL and pixel electrode P is formed in the third mask MK3a, and light is blocked from all other areas thereof. Note that because the space between the source electrode S and drain electrode D is cut by the cutting apparatus 30, the third mask MK3b also blocks light from the space between the source electrode S and drain electrode D and does not form a hydrophilic function thereon. Because the gate insulating layer I is a polyimide based resin or urethane based resin, a hydrophilic function is formed by irradiating ultraviolet rays having a wavelength of approximately 180 nm thereon. Because a lyophilic function has been formed, if the metal ink MI is applied by the droplet applying apparatus 20SD, as is shown in FIG. 6B (d), the source bus line SBL and pixel electrode P are accurately formed.

Next, FIG. 6C is a conceptual view in which a lyophilic function is formed for the applying of the light emitting layer IR and transparent electrode ITO of an organic EL element 50.

Firstly, after the source bus line SBL and the pixel electrode P have been formed as was shown in FIG. 6B (d), organic semiconductor ink is applied onto switching portions between the source electrode S and the drain electrode D so that an organic semiconductor layer OS is formed. A fourth mask MK4 is applied to the sheet substrate FB in this state in order to form a hydrophilic function only on the light emitting layer IR.

An aperture which corresponds to the light emitting layer IR is formed in the fourth mask MK4. By flashing the light source such as the excimer laser XE or excimer xenon lamp XL in synchronization with the movement speed of the sheet substrate FB, the pattern on the fourth mask MX4 is exposed onto the sheet substrate FB.

If a material which generates a lyophilic function when ultraviolet rays or the like are irradiated thereon is not contained in the metal ink MI, then it is possible to first form a high molecular thin film of PVA (polyvinyl alcohol) or the like, and irradiate ultraviolet rays having a wavelength of approximately 180 nm to then. The light emitting layer IR is then accurately formed on the pixel substrate P as is shown in FIG. 6C (e).

An aperture which corresponds to the transparent electrode ITO is formed in the fifth mask MK5. By flashing the light source such as the excimer laser XE or excimer xenon lamp XL in synchronization with the movement speed of the sheet substrate FB, the pattern on the fifth mask MK5 is exposed onto the sheet substrate FB.

The light emitting layer IR is formed by a host compound and a phosphorescent compound. If a material which generates a lyophilic function when ultraviolet rays or the like are irradiated thereon is not contained in the host material, then it is possible to first form a high molecular thin film of PVA (polyvinyl alcohol) or the like, and then irradiate ultraviolet rays having a wavelength of approximately 180 nm to then. As a result, a lyophilic function can be formed on the light emitting layer IR.

The method for forming the lyophilic function described in FIG. 6A through FIG. 6C forms the lyophilic function in each layer. Therefore, it is possible to form a lyophilic function in the top layer as well and the lyophilic function can be matched to an accurate position.

[Other Field Effect Transistors]

Figure 7:
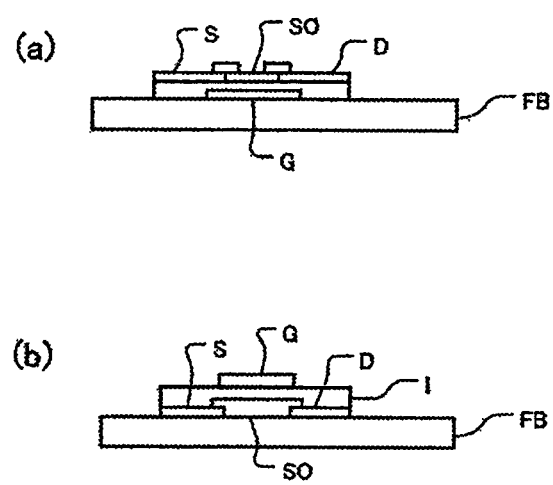
FIG. 7(a) is a cross-sectional view showing a bottom gate type field effect transistor.
FIG. 7(b) is a cross-sectional view showing a top gate type field effect transistor.

FIG. 7 is a cross-sectional view showing other types of field effect transistors. The manufacturing apparatus 100 is able to manufacture various types of field effect transistor in addition to the field effect transistor shown in FIG. 3. The field effect transistor shown in FIG. 7(a) is a bottom gate type in which a gate electrode $C_x$ a gate insulating layer I, and an organic semiconductor layer OS are formed on a sheet substrate FB, and then a source electrode S and a drain electrode D are formed.

FIG. 7(b) shows a top gate type of field effect transistor in which a source electrode S and a drain electrode D are formed on a sheet substrate FB, and then an organic semiconductor layer OS is formed, and then a gate insulating layer I and a gate electrode G are formed on the top thereof.

Either of these field effect transistors as well can also be manufactured using a manufacturing apparatus 100 in which the applying sequence of the metal ink MI or the like has been changed.

[[Operation of the Manufacturing Apparatus 100 ]]

Back to FIG. 1, the manufacturing apparatus 100 of organic EL element has a main control unit 90. The main control unit 90 controls the speeds of the supply roll RL and the rollers RR. The main control unit 90 also receives detection results for the alignment marks AM and BM from the plurality of alignment cameras CA, and controls the applying positions and timings of ink and the like of the droplet applying apparatus 20, and controls the cutting positions and timings of the cutting apparatus 30.

In particular, as a result of passing over the heat transfer roller 15 and the heat processing apparatuses BK, the sheet substrate FB expands and contracts in the X-axial direction and Y-axial direction. Because of this, in the manufacturing apparatus 100 of organic EL element, the alignment camera CA1 is located downstream of the heat transfer roller 15, and the alignment cameras CA2 through CA8 are located after the heat processing apparatuses BK.

The alignment cameras CA take images under visible light illumination using a CCD or CMOS, and process these photographic images so as to detect the positions of the alignment marks AM and BM. It is also possible for laser light to be irradiated onto the alignment marks AM and BM, and for the scattered light thereof to be received so that the positions of the alignment marks AM and BM can be detected.

Using FIG. 8 as a typical example, the control of the electrode forming processes of the manufacturing apparatus 100 of organic EL element will now be described.

In FIG. 8(a), the sheet substrate FB has at least one alignment mark AM in both sides of the sheet substrate FB respectively for the partition walls BA for the pixels and the partition walls BA for the wiring of the thin-film transistors which are lined up in the Y-axial direction which is the width direction of the sheet substrate FB. Moreover, one alignment mark BM, for example, for every 10 alignment marks AM is formed adjacent to the alignment marks AM. Because the sheet substrate FB is extremely long at, for example, 200 meters, the alignment marks BM are provided in order to make it easy to confirm at fixed intervals the row number of the thin-film transistor wiring partition walls BA and pixel partition walls BA. A pair of alignment cameras CA1 takes images of the alignment marks AM and BM, and sends the results of photographic image to the main control unit 90.

The gate droplet applying apparatus 20G is located in the Y-axial direction, and a plurality of rows of nozzles 22 are arranged in the Y-axial direction with a plurality of rows of nozzles 22 also being arranged in the X-axial direction. The gate droplet applying apparatus 20G switches the timing at which the metal ink MI is applied from the nozzles 22 and also switches the nozzles 22 which are apply the metal ink MI, in accordance with position signals sent from the main control unit 90.

The fine imprint mold 11 stipulates the positional relationships between the alignment marks AM and BM and the gate bus lines GBL and source bus lines SBL of the field effect transistors. Namely, as is shown in FIG. 8(b), a predetermined distance AY between the alignment marks AM and the gate bus lines GBL and a predetermined distance BY between the alignment marks BM and the gate bus lines GBL are stipulated in the Y-axial direction, while a predetermined distance AX between the alignment marks AM and BM and the source bus lines SBL is stipulated in the X-axial direction.

Accordingly, by taking images of the pair of alignment marks AM, any shift in the X-axial direction, any shift in the Y-axial direction, and any 0 rotation can be detected by the main control unit 90. Moreover, it is also possible to provide the alignment marks AM not only at both sides of the sheet substrate FB but also in a center area thereof.

Figure 8:
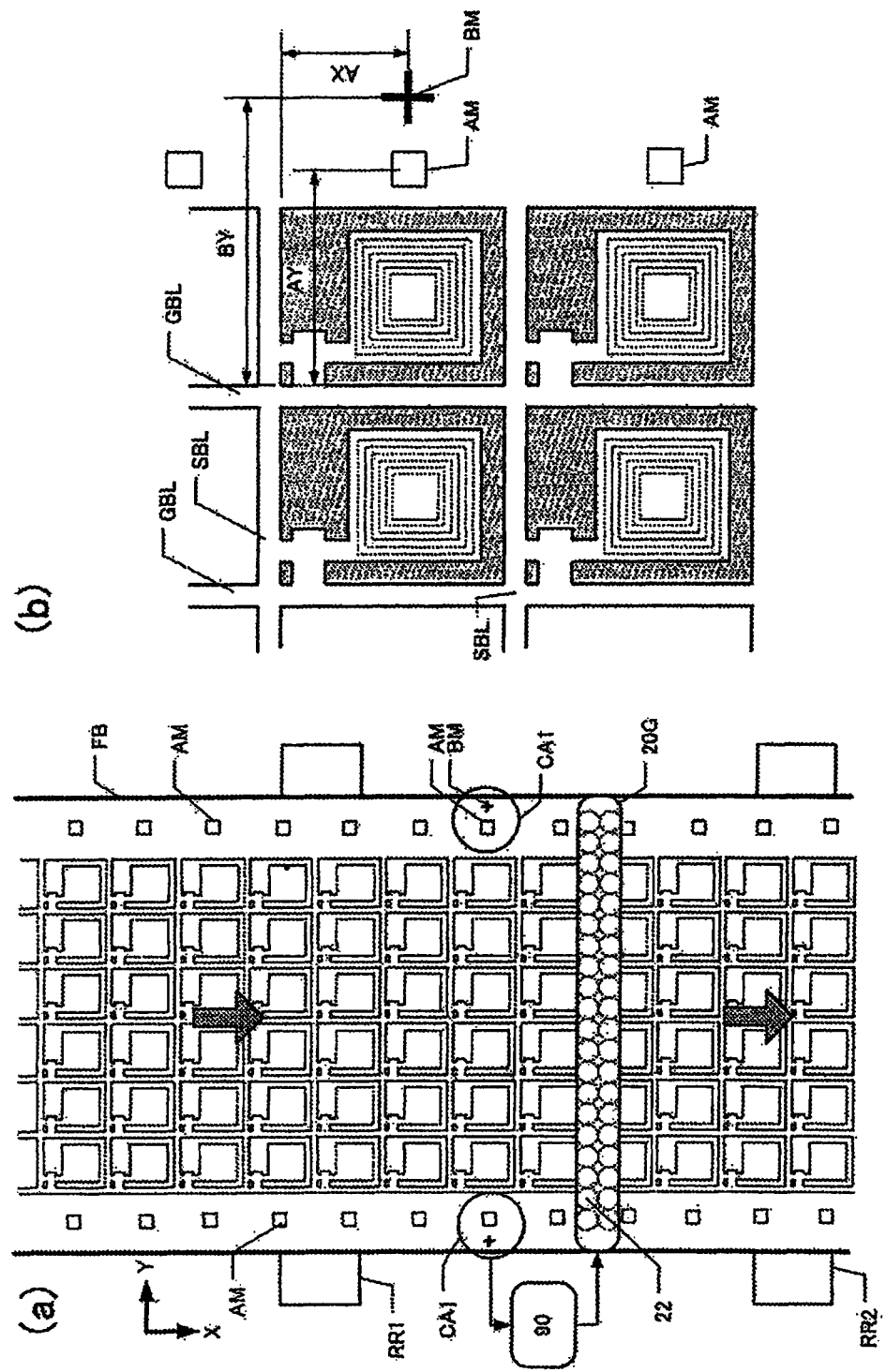
FIG. 8(a) is a top view showing an electrode forming process of the organic EL element manufacturing apparatus 100.
FIG. 8(b) is an enlarged peripheral view showing alignment marks AM and BM.

Note that, in FIG. 8, the shape of the alignment marks AM is shown as a square shape and the shape of the alignment marks BM is shown as a cruciform shape. However, they may also be other shapes such as circular marks or diagonal straight-line marks or the like.

[Overall Manufacturing Process of the Manufacturing Apparatus]

Figure 9:
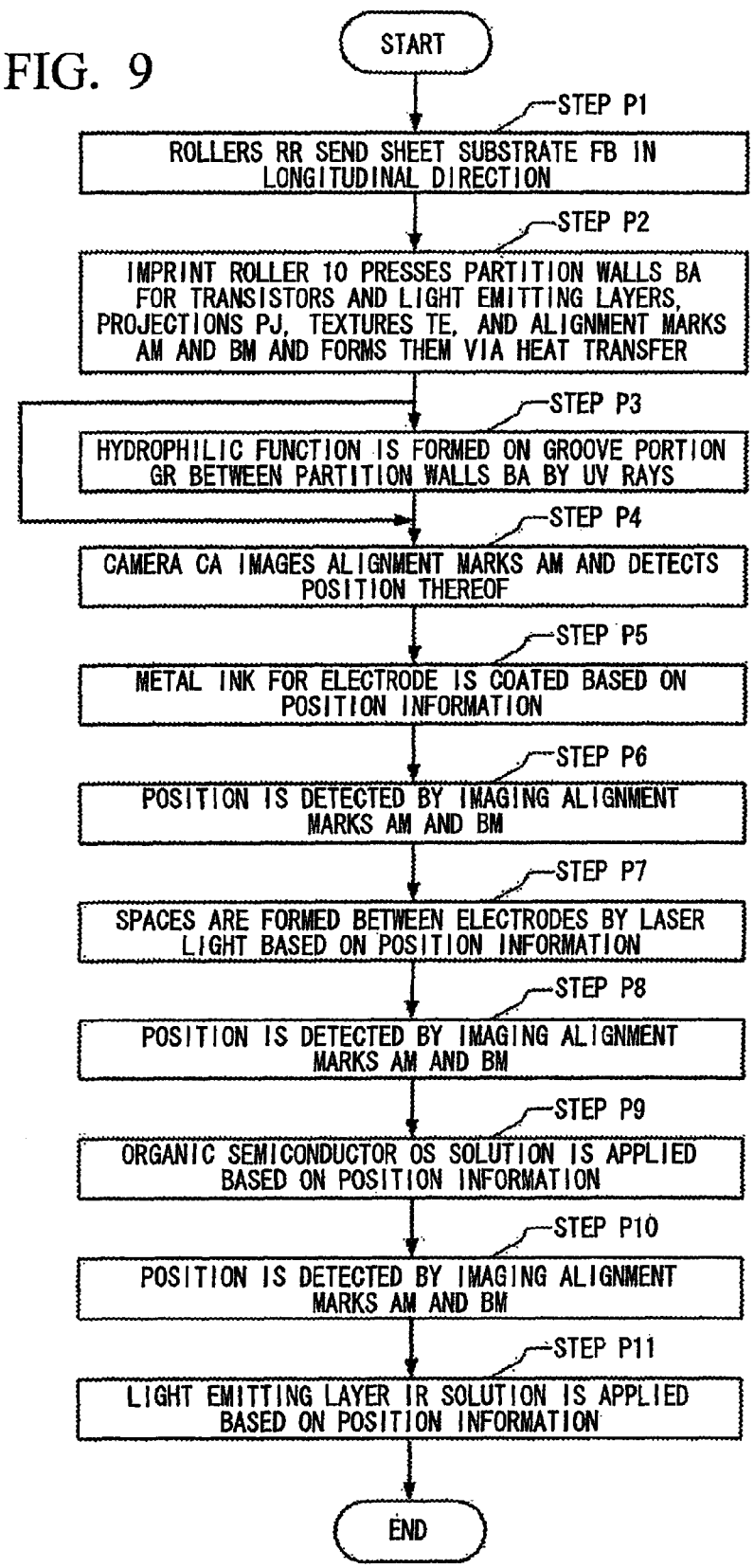
FIG. 9 is a schematic flowchart showing manufacturing processes for an organic EL element 50.

FIG. 9 is a schematic flowchart showing the manufacturing process for the organic EL element 50 shown in FIG. 1.

In step P1, the supply roll RL and the rollers RR send the sheet substrate FB in the longitudinal direction (thereof).

In step P2, the imprint roller 10 presses the sheet substrate FB so that the partition walls BA of the thin-film transistors and light emitting layers and the like, the projections PJ on the top surfaces of the partition walls BA, and the textures TE of the groove portions GR are formed. The alignment marks AM and BM and the partition Walls BA are preferably formed at the same time, as the mutual positional relationships between the two (between alignment marks and partition walls) are extremely important.

In step P3, ultraviolet rays are irradiated onto the groove portions GR of a substrate sheet which has an ethylene base using an excimer xenon lamp or the like as is required. As a result of this ultraviolet ray irradiation, the groove portions GR are furnished with a lyophilic function.

In step P4, the alignment cameras CA1 through CA3 take images of the alignment marks AM and BM, and the main control unit 90 ascertains the position of the sheet substrate FB.

Next, in step P5, based on the ascertained position information, the droplet applying apparatus 20G and the like apply the metal ink MI for the various electrodes and insulating layers.

In step P6, the alignment camera CA4 takes images of the alignment marks AM and BM, and the main control unit 90 ascertains the position of the sheet substrate FB.

Next, in step P7, based on the ascertained position information, the laser light LL forms a space between the source electrodes S and the drain electrodes D.

In step P8, the alignment camera CA5 takes images of the alignment marks AM and BM, and the main control unit 90 ascertains the position of the sheet substrate FB.

Next, in step P9, based on the ascertained position information, the organic semiconductor droplet applying apparatus 20OS applies an organic semiconductor ink in the spaces between the source electrodes S and drain electrodes D.

In step P10, the alignment camera CA6 takes images of the alignment marks AM and BM, and the main control unit 90 ascertains the position of the sheet substrate FB.

Next, in step P11, the light emitting layer IR is formed based on the ascertained position information. Thereafter, in the same way, the insulating layer I and ITO electrode are formed.

[[Example 2: Manufacturing Apparatus of Organic EL Element]]

Figure 10:
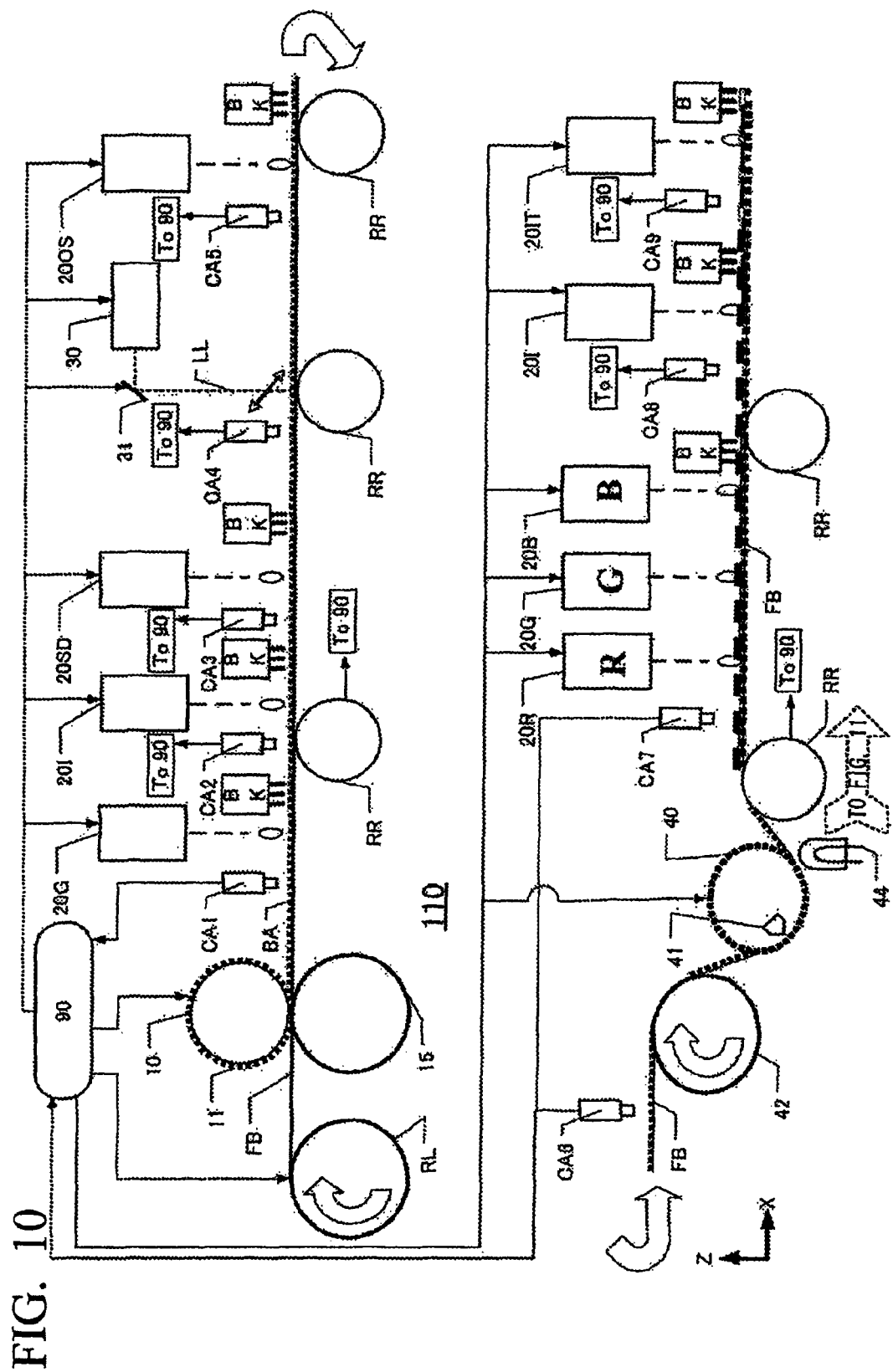
FIG. 10 is a schematic view showing the structure of a manufacturing apparatus 110 that manufactures organic EL elements.

FIG. 10 is a schematic view showing the structure of a manufacturing apparatus 110 which manufactures organic EL element which has pixel electrodes and light emitting layers and the like on a flexible substrate, and is a variant example of the manufacturing apparatus 100 shown in FIG. 1. Note that the same symbols are used for components or devices that are the same as those provided in the manufacturing apparatus 100.

The manufacturing apparatus 110 shown in FIG. 10 differs from the manufacturing apparatus 100 shown in FIG. 1 in that it has partition wall forming processes in two locations. The imprint roller 10 forms the partition walls BA for the wiring of the thin-film transistors, and forms alignment marks AM on both sides in the Y-axial direction, which is the width direction of a belt-shaped flexible sheet substrate FB. In the other partition wall forming process, a printing roller 40 is used A metal mask is formed on the printing roller 40 such that the surface thereof can perform screen printing. UV curable resin is also held in the interior of the printing roller 40. The UV curable resin is applied by a squeegee 41 onto the sheet substrate FB via the metal mask. As a result, UV curable resin partition walls BA are formed. The height of these partition walls is, for example, 20 μm. The UV curable resin partition walls BA which are formed on the sheet substrate FB are cured by a UV lamp 44 such as a mercury lamp.

It is necessary to raise the height of the partition walls BA when a light emitting layer, a positive hole transporting layer, and an electron transporting layer are formed on the organic EL element 50. In the heat transfer performed by the imprint roller 10, it is not possible to raise the height of the partition walls BA which are extruded from the sheet substrate FB. Because of this, the printing roller 40 is provided separately from the imprint roller 10.

An alignment camera CA6 is located upstream of the printing roller 40, and the main control unit 90 ascertains the position of the sheet substrate FB in front of the printing roller 40. The main control unit 90 controls the rotation of the printing roller 40, and prints the UV curable resin so as to correspond to the position of the thin-film transistors formed on the sheet substrate FB.

The UV curable resin layer is a layer whose main component is a resin which is cured when it undergoes a cross-linking reaction or the like by irradiating UV rays. Components which include a monomer having an ethylene unsaturated double bond are preferably used as the UV curable resin, and a UV cured resin layer is formed by curing the UV curable resin via the irradiation of UV rays. As the UV curable resin, it is possible to use, for example, UV curable urethane acrylate based resin, UV curable polyester acrylate based resin, UV curable epoxy acrylate based resin, UV curable polyol acrylate based resin, and UV curable epoxy resin and the like. Among these, UV curable acrylate based reason is preferable. Note that if the resin is to be used to form the partition walls BA of a light emitting layer, because a black matrix is preferable, it is also possible to introduce a metal such as chrome, an oxide, carbon or the like into the UV curable acrylate based resin.

The UV curable resin partition walls BA may also be formed on top of the partition walls BA which were formed on the sheet substrate FB by the imprint roller 10, or they may be formed in areas where the BA partition walls have not been formed by the imprint roller 10. In the subsequent light emitting layer forming process, the same type of structure as that used in the processes described in Example 1 is sufficient. Moreover, the printing roller 40 can also be formed by an imprint roller. In this case, a stamper is wound onto the roller. If the substrate is light shielding substrate, then a thermoplastic resin is used. If the substrate is transmissive substrate, then a UV curable resin is used which is cured by the UV lamp 44 and is then peeled away from the stamper.

[[Example 3: Manufacturing Apparatus of Liquid Crystal Display Element]]

Next, a manufacturing apparatus of liquid crystal display element and manufacturing method thereof will be described. Typically, a liquid crystal display element is formed by a polarization filter, a sheet substrate FB having a thin-film transistor, a liquid crystal layer, a color filter, and a polarization filter. Of these, a description has already been given about the fact that the sheet substrate FB having a thin-film transistor can be manufactured using the manufacturing apparatus 100 depicted in the top portion of FIG. 1 or using the manufacturing apparatus 110 depicted in the top portion of FIG. 10. In Example 3, a further description is given of the supplying of liquid crystal and the adhering of color filters CF.

It is necessary for liquid crystal to be supplied to a liquid crystal display element, and it is necessary to form sealing walls for the liquid crystal. Because of this, the printing roller 40 depicted in the lower portion of FIG. 10 is used in Example 3 not for the light emitting layer partition walls BA, but for the liquid crystal sealing walls.

Figure 11:
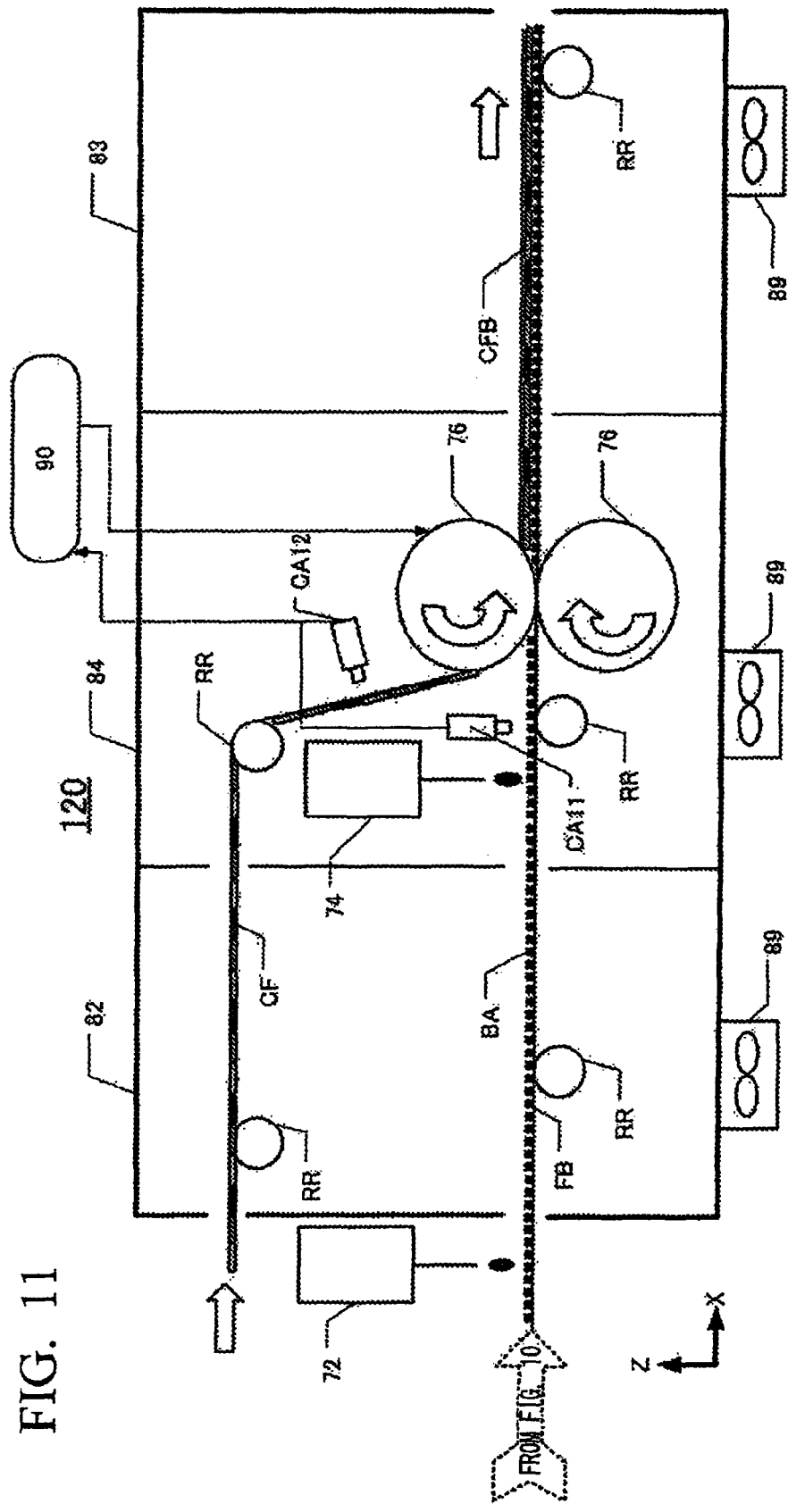
FIG. 11 shows a liquid crystal supply/color filter adhesion apparatus 120.

FIG. 11 shows a color filter adhesion apparatus 120 which doubles as a liquid crystal supply apparatus (liquid crystal supply/color filter adhesion apparatus).

This liquid crystal supply/color filter adhesion apparatus 120 has a low vacuum chamber 82 provided on the upstream side thereof and a low vacuum chamber 83 provided on the downstream side thereof, and a high vacuum chamber 84 is provided between the upstream side low vacuum chamber 82 and the downstream side low vacuum chamber 83. The low vacuum chambers 82 and 83 and the high vacuum chamber 84 are vacuumized by rotary or turbomolecular pumps 89.

Color filters CF are supplied to the upstream side low vacuum chamber 82. In addition, the sheet substrate FB on which the liquid crystal sealing walls have been formed is also supplied via the printing roller 40 shown in FIG. 10 to the upstream side low vacuum chamber 82. Note that alignment marks are also formed on both sides in the Y-axial direction of the color filters CF.

The sheet substrate FB on which the liquid crystal sealing walls have been formed is first applied by an adhesive agent dispenser 72 with a thermosetting adhesive agent that is used for the adhesion to the color filters CF. The sheet substrate FB then passes through the upstream side low vacuum chamber 82 and is fed to the high vacuum chamber 84. In the high vacuum chamber 84, liquid crystals are applied on the sheet substrate FB from the liquid crystal dispenser 74. The color filters CF and the sheet substrate FB are then adhered together by heat transfer rollers 76.

An image of the alignment marks AM on the sheet substrate FB is imaged by an alignment camera CA 11, and an image of the alignment marks AM on the color filters CF is imaged by an alignment camera CA12. The results obtained from the imaging by the alignment cameras CA11 and CA12 are sent to the main control unit 90, and any shift in the X-axial direction, any shift in the Y-axial direction, and any θ rotation can be ascertained. The heat transfer rollers 76 adjust their rotation speed in accordance with position signals sent from the main control unit 90, and the color filters CF and the sheet substrate FB are then adhered together while matching the positions thereof.

The adhered liquid crystal display element sheet CFB passes through the downstream side low vacuum chamber 83 and is sent to the outside.

Note that the adhesive agent is described as being a thermosetting adhesive agent. However, it is also possible to use a UV curable adhesive agent. In this case, a UV lamp is used instead of the heat transfer rollers 76.

INDUSTRIAL APPLICABILITY

A method for manufacturing an organic EL element and a liquid crystal display element has been described above. However, the manufacturing apparatus of the present invention can also be applied to field emission displays and the like. The present embodiment has been described using a thin-film transistor which employs an organic semiconductor. However, the present invention can also be applied to a thin-film transistor of an amorphous silicon based inorganic semiconductor.

Moreover, heat processing apparatuses BK are provided in the manufacturing apparatus 100 of the embodiments. However, with the improvements in metal inks MI or light emitting layer solutions and the like, inks and solutions which do not require heat processing have been proposed. Because of this, the heat processing apparatuses BK is not necessary to be provided in these embodiments as well.

Moreover, in FIG. 1 and FIG. 10, the imprint roller 10 is provided at the beginning. However, it is also possible for the partition walls BA to be formed by the printing roller 40 instead of the imprint roller 10.

The invention claimed is:

1. A method for manufacturing a display device having a plurality of pixel elements, thin-film transistors (TFTs), and bus lines on a flexible substrate which is fed in a longitudinal direction, the method comprising:
    (a) a lyophobic property imparting process for imparting a lyophobic property to convex portions of a plurality of partition walls, the lyophobic property being a state difficult for a liquid to bond with the convex portions of the plurality of partition walls, the plurality of partition walls being formed on a flexible substrate by convexity and concavity to correspond to each area of a plurality pixel elements, thin-film transistors (TFTs), and bus lines;
    (b) a first droplet applying process for applying droplets of liquid material to form a first layer of the pixel elements, the TFTs, or the bus lines, in the concave portions;
    (c) a lyophilic property imparting process for imparting a lyophilic property to a surface of the substrate or a surface of the first layer by applying an ultraviolet (UV) light to a same shape area of a second layer which corresponds to one or more of the pixel elements, the TFTs, or the bus lines, the lyophilic property being a state easy for the liquid to bond with the surface of the substrate or the surface of the first layer; and
    (d) a second droplet applying process for applying droplets of liquid material to form the second layer of the pixel elements, the TFTs, or the bus lines on the same shape area imparted the lyophilic property by the UV light.

2. The method for manufacturing a display device according to claim 1,
    wherein the lyophobic property imparting process (a) forms a lyophobic coating film on a surface of the partition walls.

3. The method for manufacturing a display device according to claim 2,
    wherein the partition walls are formed by pressing a mold to the substrate, the mold having a surface in which convexity and concavity define each area of the pixel elements, the TFTs and the bus lines.

4. The method for manufacturing a display device according to claim 2, the method further comprising:
    a lyophilic property imparting step for imparting the lyophilic property to a surface of the concave portions forming the first layer for the pixel elements, the TFTs or the bus lines on the substrate before the first droplet applying process.

5. The method for manufacturing a display device according to claim 2,
wherein the lyophilic property imparting process comprises applying the UV light that has a same shape area as the second layer or that has a same shape area as the first layer to the substrate, by rendering a laser light from a laser light source or using a mask pattern of exposure.

6. The method for manufacturing a display device according to claim 1,
wherein the partition walls are formed by pressing a mold to the substrate, the mold having a surface in which convexity and concavity define each area of the pixel elements, the TFTs and the bus lines.

7. the method for manufacturing a display device according to claim 1, the method further comprising:
a lyophilic property imparting step for imparting the lyophilic property to a surface of the concave portions forming the first layer for the pixel elements, the TFTs or the bus lines on the substrate before the first droplet applying process.

8. The method for manufacturing a display device according to claim 1,
wherein the lyophilic property imparting process comprises applying the UV light that has a same shape area as the second layer or that has a same shape area as the first layer to the substrate, by rendering a laser light from a laser light source or using a mask pattern of exposure.

9. A method for manufacturing a display device having a plurality of pixel elements, thin-film transistors (TFTs), and bus lines on a flexible substrate which is fed in a longitudinal direction, the method comprising:
(a) a first lyophilic property imparting process for imparting a lyophilic property to concave portions of a plurality of partition walls, the lyophilic property being a state easy for a liquid to bond with concave portions of the plurality of partition walls, the plurality of partition walls being formed on a flexible substrate by convexity and concavity to corresponds with each area of a plurality of pixel elements, thin-film transistors (TFTs), and bus lines;
(b) a first droplet applying process for applying droplets of liquid material to form a first layer of the pixel elements, the TFTs, or the bus lines, in the concave portions;
(c) a second lyophilic property imparting process for imparting a lyophilic property by applying an ultraviolet (UV) light in a same shape area of a second layer for the pixel elements, the TFTs, or the bus lines, the lyophilic property being a state for a liquid to easily bond with a surface of the first layer or a surface of the substrate; and
(d) a second droplet applying process for applying droplets of liquid material on the same shape area imparted the lyophilic property by the UV light to form the second layer of the pixel elements, the TFTs, or the bus lines.

10. The method for manufacturing a display device according to claim 9,
wherein the first lyophilic property imparting process or the second lyophilic property imparting process comprises irradiating the UV light that is a same shape area as the first layer or the same shape area of the second layer onto the substrate, by rendering a laser light from a laser light source or using a mask pattern of exposure.

11. The method for manufacturing a display deice according to claim 9, the method further comprising:
preparing a plurality of masks in which each of the masks has a pattern of an electrode of the TFT or a pattern of the bus line; and
wherein, during the lyophilic property imparting process or the second lyophilic property imparting process, the UV light is irradiated to the substrate via at least one of the plurality masks corresponding to a shape of the first layer or a shape of the second layer.

\* \* \* \* \*